(12) United States Patent
Martin et al.

(10) Patent No.: US 11,906,581 B2
(45) Date of Patent: Feb. 20, 2024

(54) HARDWARE COMPONENT AND A METHOD FOR IMPLEMENTING A CAMOUFLAGE OF CURRENT TRACES GENERATED BY A DIGITAL SYSTEM

(71) Applicant: NAGRAVISION SARL, Cheseaux-sur-Lausanne (CH)

(72) Inventors: Jean-Marie Martin, Cheseaux-sur-Lausanne (CH); Marco Macchetti, Cheseaux-sur-Lausanne (CH)

(73) Assignee: NAGRAVISION SARL, Cheseaux-sur-Lausanne (CH)

( * ) Notice: Subject to any disclaimer, the term of this patent is extended or adjusted under 35 U.S.C. 154(b) by 0 days.

(21) Appl. No.: 17/627,324

(22) PCT Filed: Jul. 17, 2020

(86) PCT No.: PCT/EP2020/070381
§ 371 (c)(1),
(2) Date: Jan. 14, 2022

(87) PCT Pub. No.: WO2021/009378
PCT Pub. Date: Jan. 21, 2021

(65) Prior Publication Data
US 2022/0276303 A1    Sep. 1, 2022

(30) Foreign Application Priority Data
Jul. 18, 2019  (EP) ..................... 19187091

(51) Int. Cl.
*G01R 31/3177* (2006.01)
*H04K 3/00* (2006.01)

(52) U.S. Cl.
CPC ........... *G01R 31/3177* (2013.01); *H04K 3/28* (2013.01); *H04K 3/43* (2013.01); *H04K 3/60* (2013.01);
(Continued)

(58) Field of Classification Search
CPC ........ G01R 31/3177; H04K 3/28; H04K 3/43; H04K 3/60; H04K 3/825; H04K 3/94; H04K 3/41; H04K 3/45
(Continued)

(56) References Cited

U.S. PATENT DOCUMENTS 9,564,883 B1 *   2/2017  Quinton ............... H03K 3/0375
11,533,598 B2 * 12/2022  Junk .................... H04W 12/106
(Continued)

FOREIGN PATENT DOCUMENTS

EP         2 280 502 A2     2/2011
WO    WO 2012/122994 A1    9/2016

OTHER PUBLICATIONS

Extended European Search Report dated Jan. 24, 2020 for European Patent Application No. 19187091.4, 8 pages.
(Continued)

*Primary Examiner* — John J Tabone, Jr.
(74) *Attorney, Agent, or Firm* — POLSINELLI LLP

(57) ABSTRACT

Implementing a camouflage of current traces generated by a hardware component having one or more set of digital elements defining a plurality of operational datapaths comprises adjusting (761) one or more working condition(s) of the hardware component, measuring (762) a reaction of the hardware component to the working condition(s) by a logic test circuit through processing data operations along a reference datapath having a minimum duration corresponding to at least the longest of the operational datapaths, and in response to detecting an error (763) along the reference
(Continued)

datapath, modifying (764) the working condition(s) so that the error generated by the logic test circuit is cancelled. Applications to countermeasures to side-channel attacks.

18 Claims, 18 Drawing Sheets

(52) U.S. Cl.
CPC ............... *H04K 3/825* (2013.01); *H04K 3/94* (2013.01); *H04K 3/41* (2013.01); *H04K 3/45* (2013.01)

(58) Field of Classification Search
USPC .................................................. 714/726, 740
See application file for complete search history.

(56) References Cited

U.S. PATENT DOCUMENTS

| | | | | |
|---|---|---|---|---|
| 2005/0271202 | A1* | 12/2005 | Shu | G06F 9/3001 712/E9.035 |
| 2011/0138192 | A1 | 6/2011 | Kocher et al. | |
| 2013/0247194 | A1* | 9/2013 | Jha | H04L 63/1425 726/23 |
| 2015/0381351 | A1* | 12/2015 | Kuenemund | G06F 21/72 713/189 |
| 2016/0119168 | A1* | 4/2016 | Roy | H04B 1/16 375/238 |
| 2016/0349316 | A1 | 12/2016 | Miro Panades | |
| 2018/0012020 | A1* | 1/2018 | Prvulovic | G06F 21/552 |
| 2018/0337932 | A1* | 11/2018 | Juster | G06F 21/35 |
| 2022/0276303 | A1* | 9/2022 | Martin | H04K 3/94 |

OTHER PUBLICATIONS

International Search Report and Written Opinion for PCT Application No. PCT/EP2020/070381 dated Sep. 10, 2020, 14 pages.

* cited by examiner

HARDWARE COMPONENT AND A METHOD FOR IMPLEMENTING A CAMOUFLAGE OF CURRENT TRACES GENERATED BY A DIGITAL SYSTEM

CROSS-REFERENCES TO RELATED APPLICATIONS

This application is a U.S. National Stage of PCT Application No. PCT/EP2020/070381, filed Jul. 17, 2020, which claims the priority benefit of European Patent Application No. 19187091.4 filed on Jul. 18, 2019, both of which are incorporated herein by reference in their entirety for all purposes.

TECHNICAL FIELD

The invention relates to the camouflage of digital current traces, in particular in the frame of countermeasures to side-channel attacks.

BACKGROUND ART

Side-channel attacks are based on signals gained from the material execution of algorithms, e.g. power consumption, timing data or electromagnetic leaks, instead of relying on weaknesses of the algorithms themselves. In computer security, they raise a significant risk of having secret information fraudulently retrieved, all the more since they are usually non-intrusive and undetectable. In this respect, even strongest cryptography algorithms are subject to being discreetly analysed and identified from outside.

Such side-channel attacks can notably rely on power analysis, consisting in studying the power consumption of a hardware device, implementations of which include SPA for "Simple Power Analysis" (visually interpreting power traces) and DPA for "Differential Power Analysis" (exploiting statistical analysis of collected data).

A number of hardware and digital solutions have been developed over years for preventing those attacks or making them unsuccessful. Some of them are based on decreasing as much as possible intensities of released signals relevant to key operations. Though being able to reduce significantly related risks, appropriate means require dedicated material implementations, which may be costly and complex, and cannot fully prevent signal leakage.

Other solutions are based on purposely generating noise in the perceptible signals so as to blind hackers to meaningful reverse analysis information, which can be done notably by randomly introducing timing modifications (clock domains, jitter), amplitude modifications (filters, noise engines) or by dynamic reconfigurations.

Those solutions, however, may lead to material execution failures, due in particular to glitches, i.e. short-lived system faults, which are usually more difficult to troubleshoot than e.g. software bugs. Those may notably include timing violations.

In this respect, various provisions and technologies have been proposed in order to ensure correct electronics working and decrease failure rates. In particular, when randomly varying parameter values, it is usually recommended to hold a predefined safety margin with respect to critical bounds, which may e.g. lead to forbidding a range of offset values within a risk area when introducing delays.

Such provisions can make countermeasure jamming safer, but at the expense of camouflage efficiency. Also, they cannot fully prevent anyway related failure risks. In fact, a delicate trade-off needs to be established between failure risks and efficiency, which may never be fully satisfying.

SUMMARY

A purpose of the present disclosure is to provide a solution for implementing a camouflage of current traces by introducing noise in perceptible signals, so as to reduce risks of side-channel attacks, while potentially enabling relatively broad ranges of jamming values without causing significantly increased execution failures.

More particularly, in advantageous embodiments, the present disclosure can substantially reduce or avoid critical trade-off choices between efficiency and execution safety in determining suited jamming conditions.

In addition, the disclosed solutions may possibly be implemented in relatively economic and simple ways whether in existing or in dedicated systems.

In this respect, an object of the present disclosure is notably a method for implementing a camouflage of current traces generated by a hardware component, that hardware component having at least one set of digital elements defining a plurality of operational datapaths. The method comprises:
 (a) adjusting, by a control element, a working condition of the hardware component;
 (b) measuring a reaction of the hardware component to the working condition(s) by a logic test circuit through processing data operations along a reference datapath, that reference datapath having a minimum duration corresponding to at least the longest of the operational datapaths in the hardware component;
 (c) detecting whether an error has taken place along the reference datapath by the logic test circuit;
 (d) in response to detecting an error along the reference datapath by the logic test circuit, modifying the working condition(s) by the control element, to generate a modified working condition.

It is preferred that the modification of the working condition is such that the error generated by the logic test circuit with the working condition(s) is cancelled. Throughout this application, various examples of the cancellation of the error will be described. In some cases, the method may not explicitly include the detecting step. It will be appreciated that the presence of a step taking place "in response to detecting an error" implies that some kind of detection step may have taken place outside the confines of the method of the present invention.

The hardware component comprises digital parts, including the digital elements, but may also include analog parts. Also, it may further possibly include software, e.g. as firmware providing a low-level control of a hardware part. The hardware component is prone to generating potentially perceptible traces in its environment. It may be relevant to cryptology algorithms.

The digital elements may e.g. be logic gates or combinations of logic gates such as flip-flops or latches. The operational datapaths defined by the digital elements may further include registers and buses.

The "longest" operational datapath is the operational datapath, among those defined by the digital elements, that takes the longest time to run through. It usually corresponds to the highest number of basic elements, such as logic gates.

More precisely, each datapath exhibits a propagation delay which is the time starting at the edge of the clock until the last element of the datapath has stabilized the new state. In a simple example represented by a flip-flop and a gate at the output of the flip-flop, the propagation delay is the sum of the reaction of the flip-flop and the gate. At the edge of the clock, the flip-flip will change its output within a first propagation delay Tff. The output of the flip-flop is connected to the gate which has another propagation delay Tg. In case that the output of the gate is connected to the input of a second flip-flop, the input of the second flip-flip is updated after the sum of the propagation delays, namely Tff+Tg. This delay is called the propagation delay for this datapath.

The minimal time between two edges of the clock is therefore equal to Tff+Tg. In complex logic circuit, several elements are connected together, in series or in parallel and one step of the present method is to determine the longest datapath defining the longest propagation delay.

It is to be noted that the propagation delay is preferably determined in number of elements rather than in absolute time. The longest propagation delay is then used to define a reference datapath that may comprise the same number of elements (or compatible elements having the same propagation time) plus at least one element.

In variant implementations, the reference datapath comprises the same number of digital elements as in the longest datapath, but at least one of those elements has a longer duration than a corresponding element in the longest datapath.

The reference datapath has thus a minimum duration that "corresponds" to at least the longest of the operational datapaths in the sense that it comprises elements that may provide at least a similar running-through duration.

For example, an "OR" gate may be possibly represented by the same "OR" gate, or by a "NAND" gate insofar as the running duration of the latter is close to the running duration of the former.

In particular examples, all logic gates of the longest operational datapath are respectively represented by a series of successive identical inverter (i.e. NOT) gates. In other examples, one or more of the logic gates forming a series in the reference datapath are gates having two entries (such as e.g. NAND or NOR), one of those entries receiving a fixed data value.

It should be noted that the durations of the digital elements, e.g. of the logic gates, may depend on the technology underlying those elements. This regards not only the individual absolute running durations, but also the relative running durations between distinct types of digital elements. For logic gates, the implementation technologies may notably be selected among diodes or transistors, or electromagnetic relays.

The concerned working conditions can cover any parameter varied in executing the operational datapath with the hardware component, which may notably include clock frequency and/or supply voltage.

Accordingly, the method is based on a test-and-adjust approach, in which the deployment over time of the working condition(s) is dynamically calibrated upstream to a correct working of the system by means of a suited reference datapath.

In appropriate modes, this makes possible finely tuned setting of the working conditions, so as to make them possibly close to triggering failures while safely avoiding the latter, thereby significantly broadening the range of applicable jamming in a secured way.

Notably, the working conditions may be selected between bounds pushed away with respect to existing solutions.

In this respect, an overall propagation delay, defined as a delay between a clock edge and a latest commutation of any of the digital elements in the hardware component, may be fully taken into account while ensuring a correct working thanks to the reference datapath testing. Indeed, by construction, such an overall propagation delay may be dealt with through a reference propagation delay, defined for the reference datapath as a delay between a clock edge and a latest commutation, i.e. of the digital element at the end of the reference datapath.

Typically, randomly picking clock frequency values may reach relatively high levels, and randomly picking supply voltage values may reach relatively low levels, compared with the possibilities offered so far in the state of the art.

Surprisingly, the method of the present disclosure does not point to complex trade-off choices, highly precautionary implementations or sophisticated adjustments, but may be based on flexible testing.

The working conditions have successive values that may be obtained from random or pseudo-random sources. They may also be obtained by exploiting predetermined sequences in a look-up table or LUT, or by using sequences numerically generated over time through suited algorithms.

In advantageous modes, the values of the working conditions are appropriate for obfuscating potential hackers, and for making reverse engineering of potentially captured released signals difficult. Accordingly, those values may be such that they generate apparent noise so that they may be externally perceived as random values. In alternative modes, those values correspond to fake information, blurring the effective signals with fictitiously meaningful data.

In particular execution modes, the control element modifies iteratively the working condition(s) for a given operation step until no error is detected in testing that step. It may thus be ensured that the working condition(s) adopted further to two or more modifications does not trigger failures and is safe for that step, the camouflage process being then pursued with following operation steps.

In particular implementations, the method comprises iterating over time the steps of adjusting, measuring, and modifying in response to detecting an error.

The iterations may be pursued in a continuous way and indefinitely. In alternative modes, they may be stopped when a whole desired set of encryption and/or decryption operations has been completed. Such a desired set may be predetermined.

In particular implementations, the working condition(s) comprise(s) at least one of a supply voltage and a clock frequency applied to the hardware component.

Then, according to specific related modes:
  adjusting the working condition(s) comprises increasing the clock frequency, and cancelling the error comprises decreasing the clock frequency;
  adjusting the working condition(s) comprises decreasing the supply voltage, and cancelling the error comprises increasing the supply voltage.

In other implementations, the working conditions include internal working power and/or capacitor properties. The exploited working condition may be single, or two or more types of the working conditions may be used together in any combination. The method of the disclosure may possibly allow such combinations in a flexible way without significant additional complexity.

In some modes, the minimum duration is defined as corresponding to the longest of the operational datapaths in the hardware component plus a duration margin.

Namely, the reference datapath has a running duration that is at least a bit greater than the duration of the longest datapath. This makes possible the identification of errors beyond the strict duration of the longest datapath, which enables to be safer with respect to potential operational failures. In this respect, the reference datapath defines a worst case scenario with the aim of detecting an error in the propagation of a signal along the elements forming the reference datapath while reaching the limit of working conditions. Since the reference datapath is longer than any of the operational datapaths, the latter will still work correctly while the reference datapath detects an error.

The duration margin may be implemented in the form of an additional digital element in the reference datapath, for example a further logic gate in a series of elements.

In particular modes, the logic test circuit comprises a data input, a data output and a comparison module, and the comparison module determines an error status in case a value of the data output is not equal to a predefined function of a value of the data input.

This may provide a fine identification of errors along the reference datapath.

In some implementations where the reference datapath comprises a series of chained digital elements, the comparison is made not only at the data output of the whole reference datapath, but also at the data output of at least one (and possibly each) of the intermediary digital elements in the series (an intermediary element designating any of the chained digital elements except the last one). This may provide a finer identification of failure occurrences.

In particular implementations, the hardware component is synchronized by a clock input having a clock cycle, and the measuring step by the logic test circuit is executed at each clock cycle.

In specific implementations involving the comparison module above, this is reflected by changing an entry of the reference datapath at each clock cycle, i.e. by swapping between 0 and 1 for at least one of the input bits. The changes may be effected at the rising or falling edge.

In variant modes, measuring the reaction of the hardware component to the working condition(s) is carried out only for some of the clock cycles and not for others. For example, the measuring is effected only beyond some threshold values of the working conditions, which may themselves depend on whether the working conditions are increased or decreased.

In particularly interesting modes, at least one element of the hardware component comprises a programmable delay element of a given function on at least one of the operational datapaths. Then, the method comprises:
  enabling the programmable delay element in that or those operational datapaths,
  if the programmable delay element is part of the longest of the operational datapaths, enabling an identical delay element in the reference datapath.

Such modes may possibly enable to introduce substantial levels of further complexity in the blurring of the signals, thereby strengthening the countermeasures against side-channel attacks.

According to particular implementations thereof, which may be carried out separately or in any combinations:
  the programmable delay element is applied to a clock input of the given function,
  the programmable delay element is applied to a data input of the given function,
  the programmable delay element is applied to a data output of the given function.

Applying a delay to part only of the operand inputs, e.g. one out of two, may amount to a datapath trimming. Applying a delay to all the operand inputs or to a result output may amount to a clock skew trimming (respectively applied upstream or downstream of a corresponding processing operation).

In specific modes, the method includes obtaining at least one security delay margin and determining at least one of the delays so that no error occurs in executing elementary operation(s) and so that increasing the delay(s) beyond the security delay margin causes an error to occur in executing the elementary operation(s).

In some execution modes, the method comprises generating a random value and using that random value by the control element to adjust the working condition(s) of the hardware component. This process may be referred to as a "sweeping" process in which the working conditions are varied randomly and often. The combination of this sweeping of the working conditions with the continuous checking that those working conditions do not give rise to any errors in the reference datapath ensures an effective jamming operation, with no requirement that somewhat limiting values of the working conditions need be imposed. As is described throughout this application, the "sweeping" process may take place simply by adjusting the working conditions in random steps, or by setting a target value, and cautiously approaching the target value to ensure that no errors take place. Each of this approaches, and others, are effective in providing an advantageous method of implementing camouflage of current traces.

By "random value", it is meant a value obtain by a random or a pseudo-random process.

In more specific modes, the method comprises using the random value by the control element as a target value, and adjusting iteratively the working condition(s) of the hardware component towards the target value.

The iterations may be pursued until the target value is reached, i.e. until the considered working condition is equal or superior to that target value, or until an error is detected.

The iterations applied to the values of the working condition(s) may be regular over time and based on a fixed elementary variation step of the working condition(s) (typically designated as a "unit" offset) executed at each clock cycle (typically at each rising edge or falling edge). The step is e.g. small enough with respect to average variation gaps of the working condition(s) between consecutive target values but large enough to avoid too regular a time evolution. Such an achievement may provide smooth entry value transition, which may possibly avoid sharp variations potentially causing overshoot or instability effects.

In variant implementations, the step variations are not executed at each clock cycle, but after a random number of clock cycles. In still variant implementations, which may be combined with the previous ones, the step of the working condition(s) is not fixed but varies between consecutive steps, e.g. within a predetermined range of values and in a random way. Those variant implementations may still increase the jamming of the emitted signals.

In alternative modes, the next value of the considered working condition corresponds directly to the random value, without exploiting smoothing steps. The level of jamming may thus be increased, as a counterpart to potential overshoot or instability effects.

In some achievements, the method comprises providing at least one working condition security margin with respect to at least one working bound of the working condition(s). For example, the working condition is a supply voltage, having a minimum required level for correct working, and the corresponding security margin is a voltage gap above the minimum level. In another example, the working condition is a clock frequency, having a maximum authorized level for correct working, and the corresponding security margin is a frequency gap below the maximum level.

As presently explained, such voltage gap and frequency gap may possibly be substantially reduced with respect to previously existing solutions.

Another object of the present disclosure is a hardware component configured to executing the method for implementing a camouflage according to any of the execution modes of the disclosure, the hardware component comprising:

- at least one set of digital elements defining a plurality of operational datapaths,
- a control element acting on at least one working condition of the hardware component,
- a logic test circuit for processing data operations along a reference datapath, the reference datapath having a minimum duration corresponding to at least the longest of the operational datapaths in the hardware component.

The control element is configured to adjust the working condition(s), and in response to determining that the logic test circuit detects an error along the reference datapath, to modify the working condition(s) so that the error generated by the logic test circuit with the working condition(s) is cancelled.

In particular, in some implementations, the logic test circuit comprises a data input and a data output, and is configured to determine an error status in case a value of the data output is not equal to a predefined function of a value of the data input.

In some embodiments, the working condition(s) comprises at least one of a supply voltage and a clock frequency.

Then, in specific modes that can be implemented alone or in combination:

- the hardware component comprises a variable output voltage generator, the control element controlling an output voltage of the output voltage generator, the output voltage powering at least part of the elements of the hardware component and belonging to the working condition(s);
- the hardware component comprises a clock frequency generator able to generate a variable frequency signal, that control element controlling the frequency signal of the clock frequency generator, the variable frequency signal synchronizing at least part of the elements of the hardware component and belonging to the working condition(s).

In particular embodiments, the hardware component comprises a programmable delay element on at least one of the operational datapaths. Also, the control element is configured to enable the programmable delay element in that or those operational datapaths and, if the programmable delay element is part of the longest of the operational datapaths, to enable an identical delay element in the reference datapath.

In some implementations, the hardware component comprises a random value generator, and the control element is configured to use the random value generator to adjust the working condition(s) of the hardware component.

In particular embodiments with parallel sequencing, the hardware component comprises at least two engines alternately testing the hardware component(s) with the reference datapath and running the operational datapaths relying on that testing, at least one of the engines proceeding with the testing while at least one other of the engines is proceeding with the running.

LIST OF FIGURES

The present disclosure will be better understood, and other specific features and advantages will emerge upon reading the following description of particular and non-restrictive illustrative embodiments, the description making reference to the annexed drawings wherein.

Figure 1:
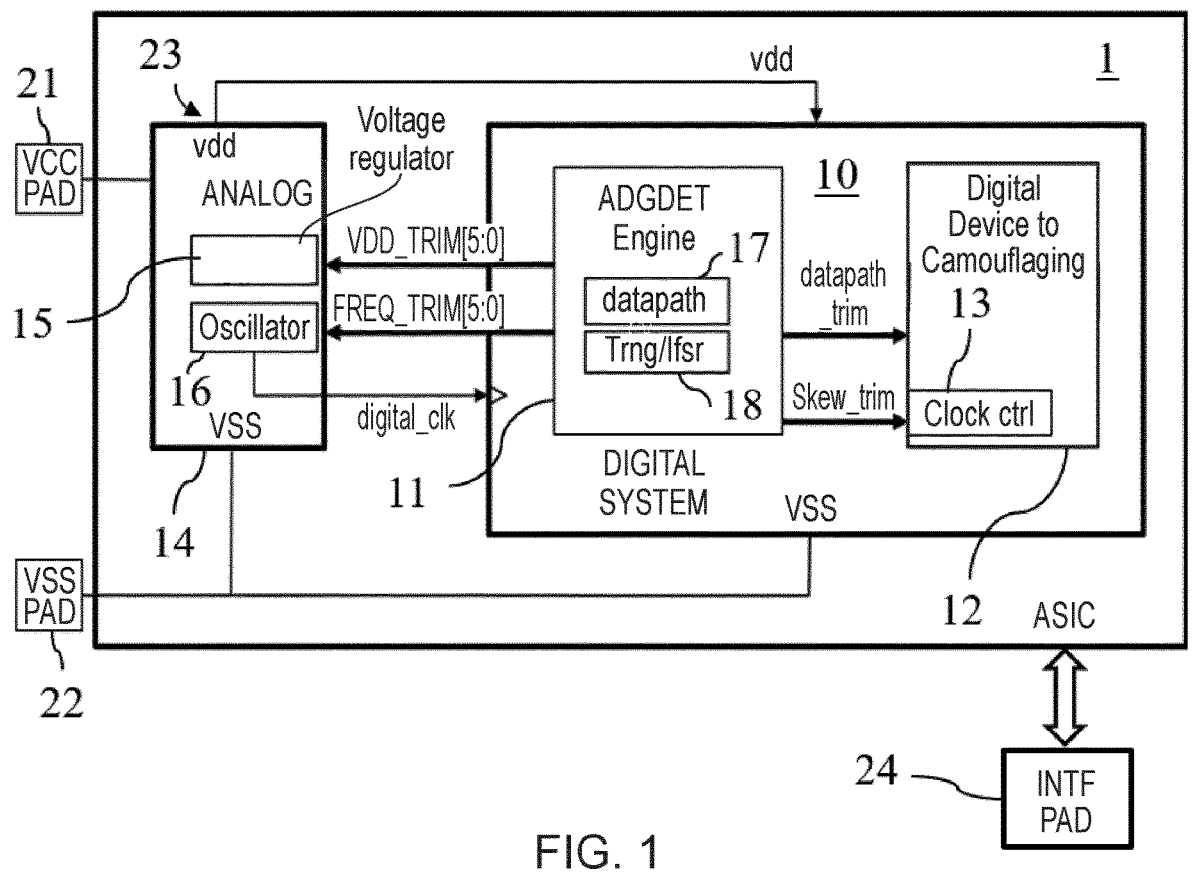
FIG. 1 represents a principle diagram of an ASIC (for Application-Specific Integrated Circuit) integrating functionalities of a hardware component configured for implementing a camouflage according to the disclosure.
Figure 15:
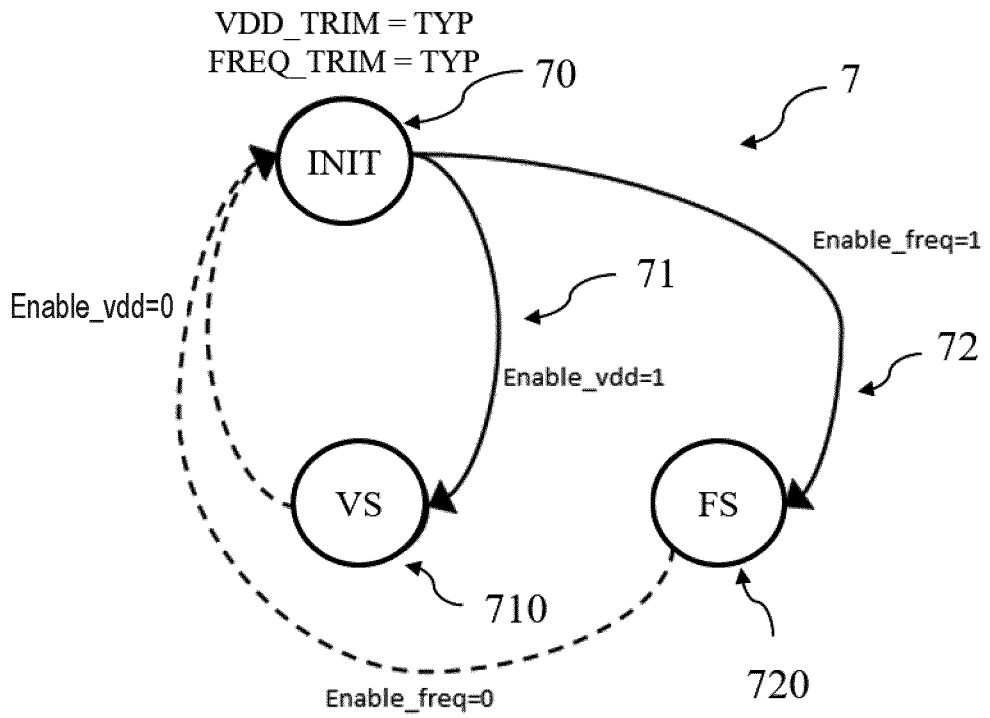
FIG. 15 represents an abstract computation model or FSM (for Finite-State Machine) run with the hardware component of FIG. 1 in a particular embodiment.
Figure 17:
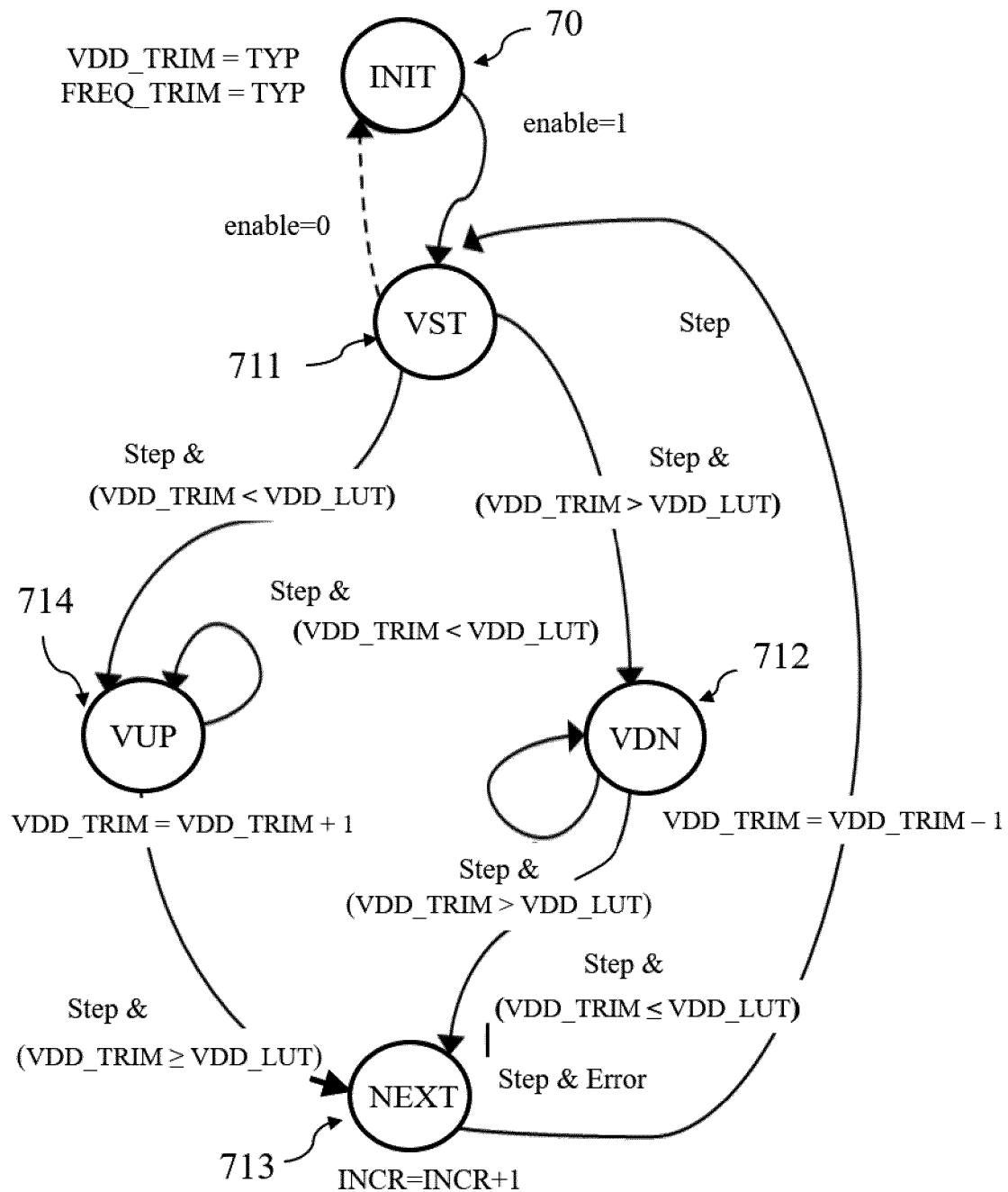
Figure 18:
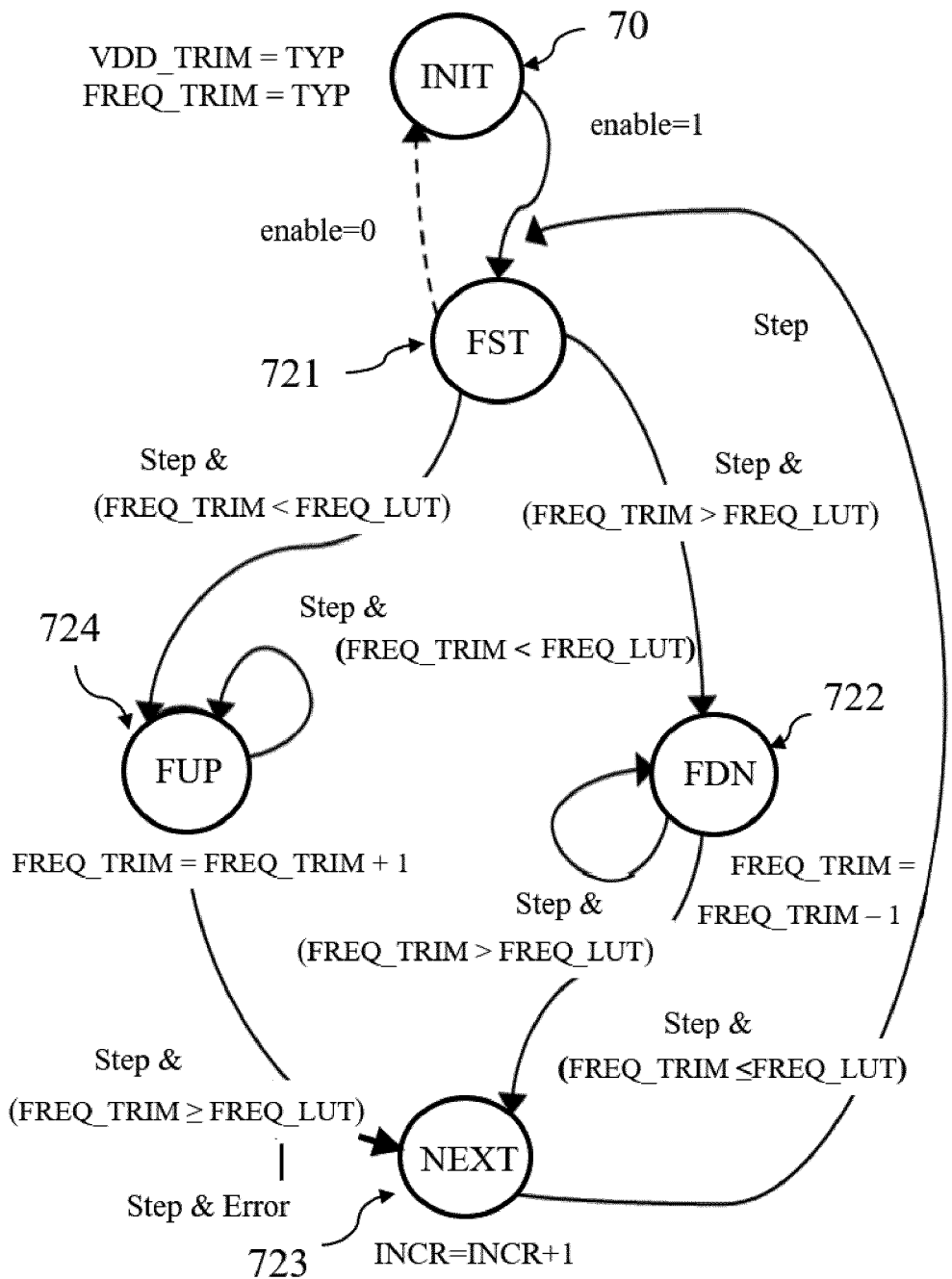
Figure 19:
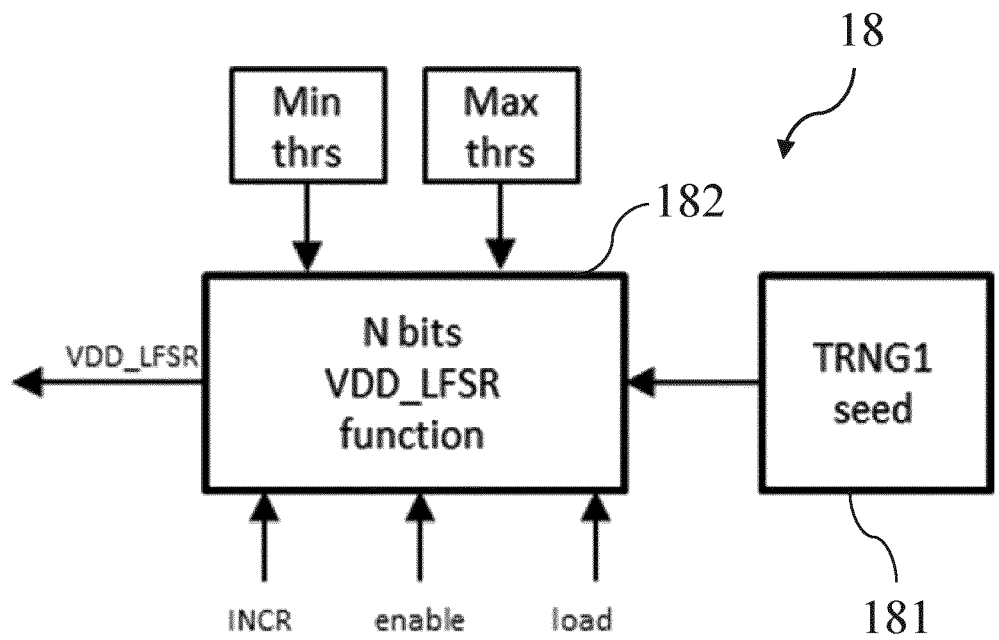
Figure 20:
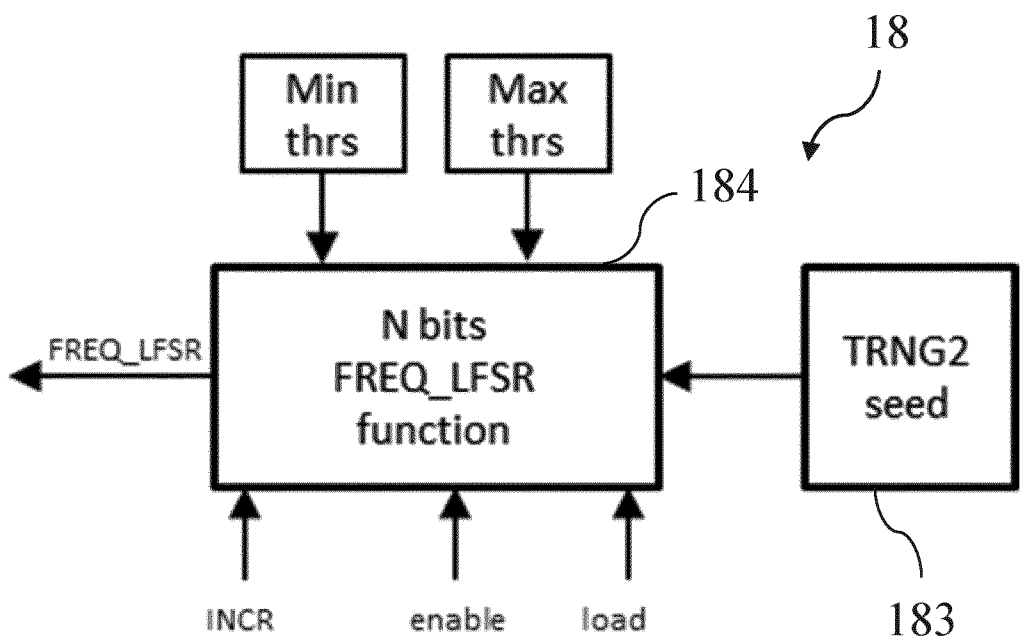
Figure 21:
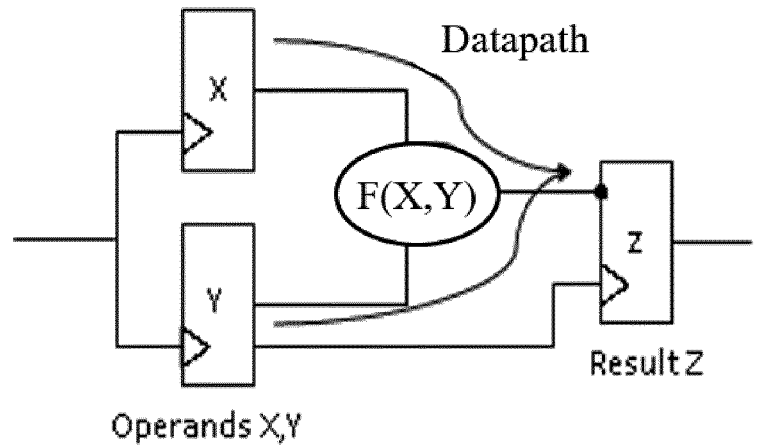
Figure 22:
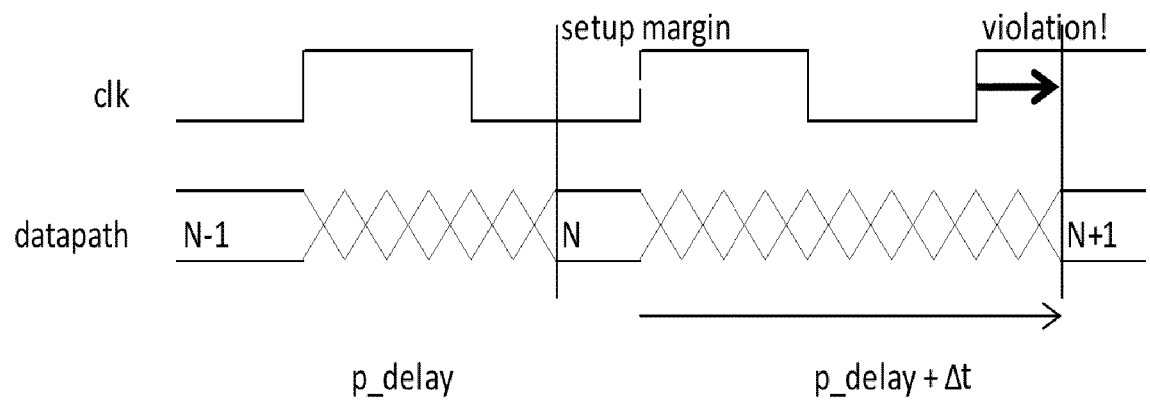
Figure 23:
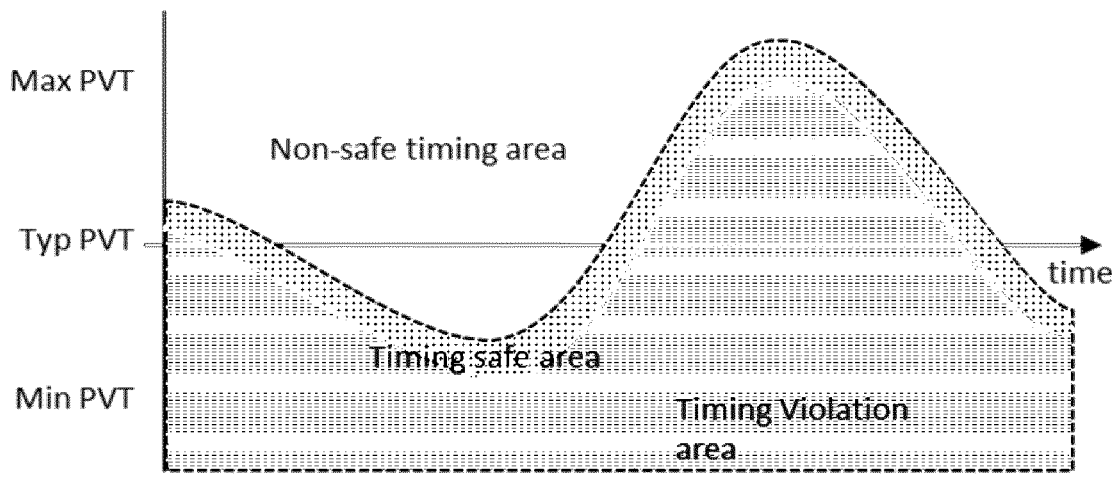
Figure 24:
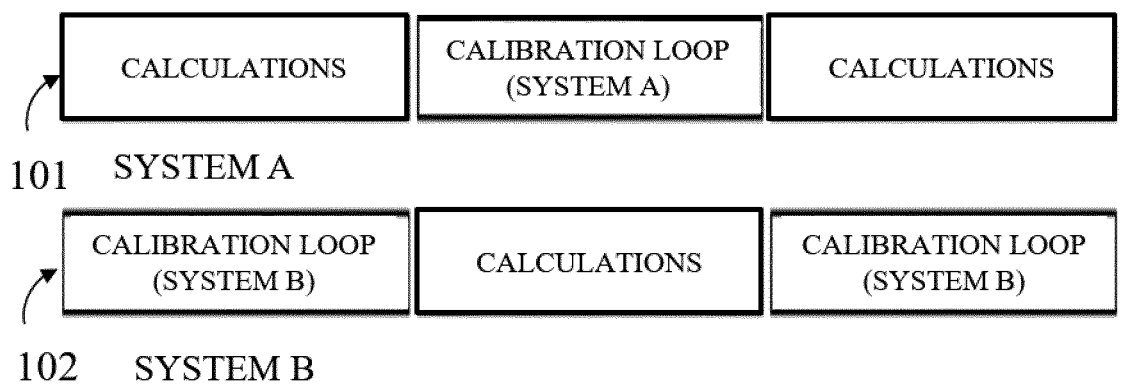
Figure 25:
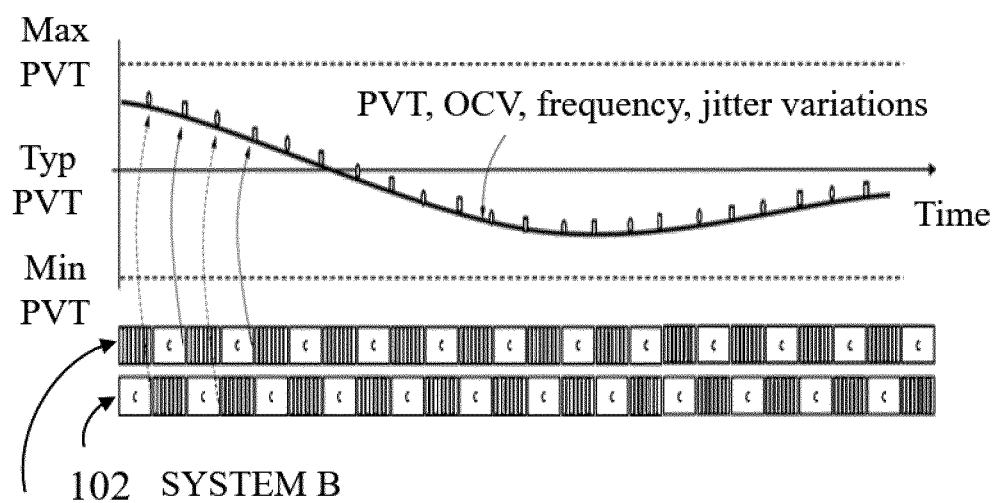
Figure 26:
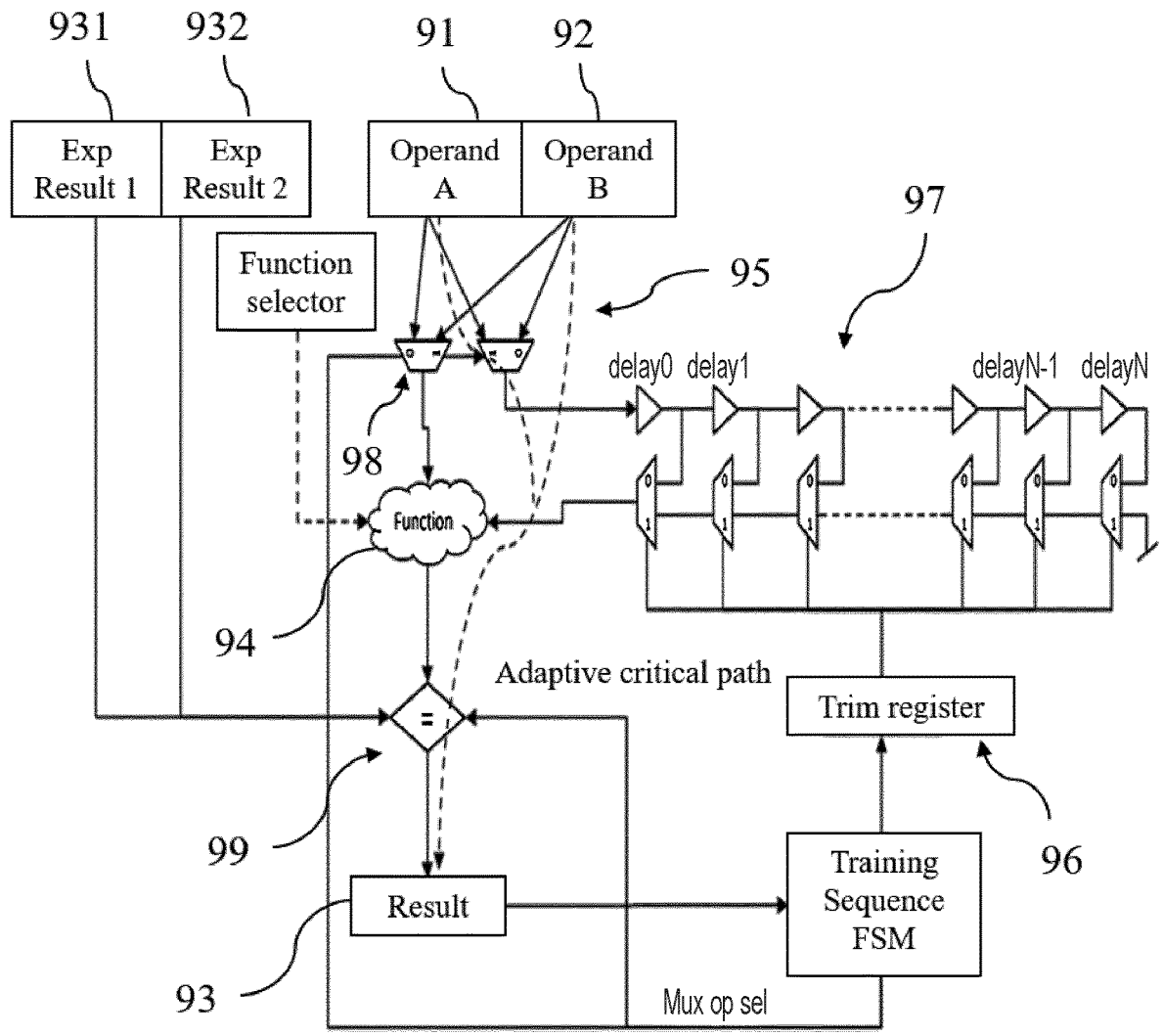
Figure 27:
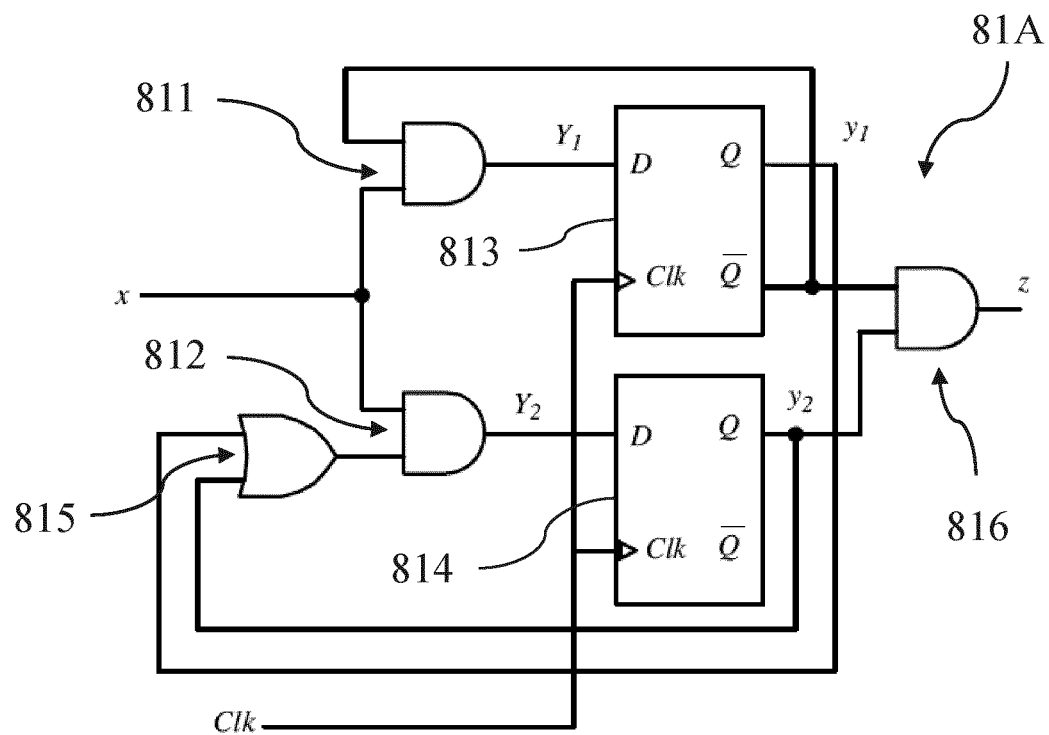
Figure 28:
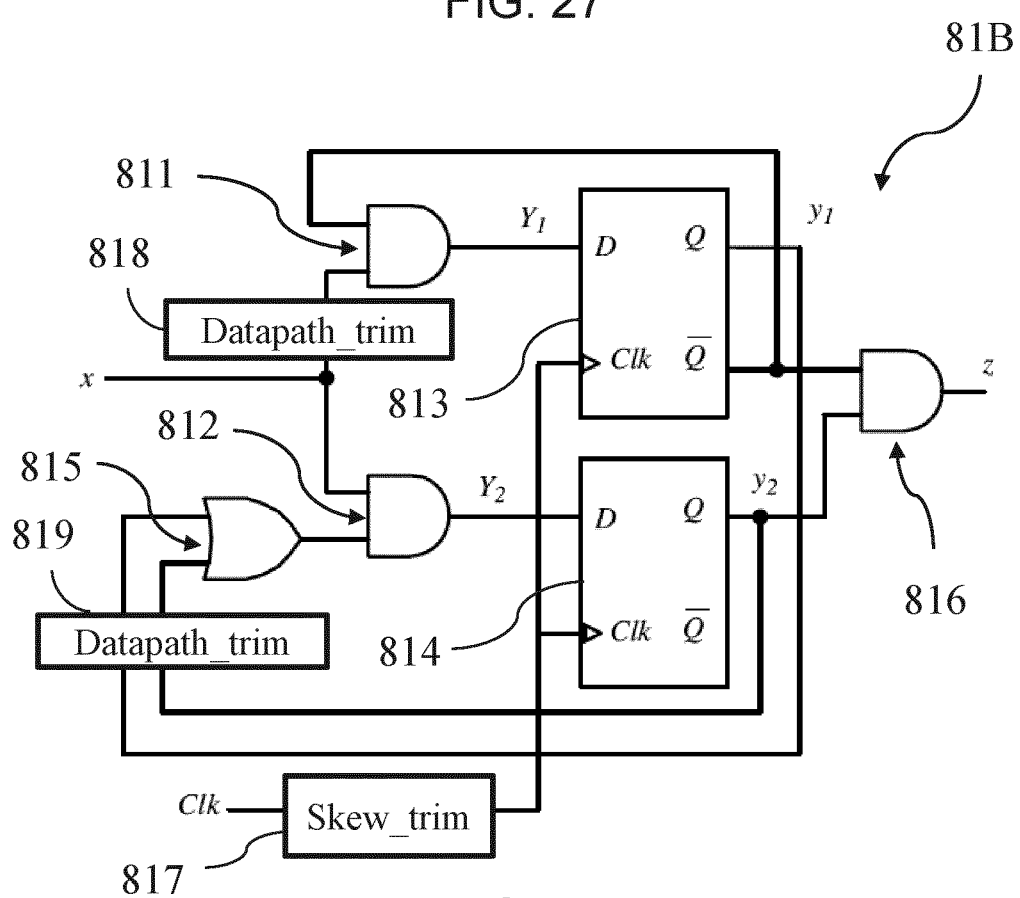

FIG. 17 details a first sub-model part of the FSM of FIG. 15, dedicated to voltage regulator modulation, together with a related flow chart;

FIG. 18 details a second sub-model part of the FSM of FIG. 15, dedicated to frequency modulation, together with a related flow chart;

FIG. 19 is a principle representation of a generator of pseudo-random numbers exploited for voltage modulation in the first sub-model part of FIG. 17;

FIG. 20 is a principle representation of a generator of pseudo-random numbers exploited for frequency modulation in the second sub-model part of FIG. 18;

FIG. 21 is a principle illustration showing a processing operation of a datapath elementary data, as carried out with the hardware component of FIG. 1;

FIG. 22 illustrates the effects of modifying datapath delays in the hardware component of FIG. 1;

FIG. 23 shows a principle time evolution of PVT drift (for Process, Voltage and Temperature) as obtained with the hardware component of FIG. 1;

FIG. 24 represents an adaptive timing design exploited in the hardware component of FIG. 1 with the FSM of FIG. 15, based on two combined engines;

FIG. 25 shows a time evolution of PVT drift in line with the principle representation of FIG. 23, while illustrating a progressive data processing by the two combined engines of FIG. 24;

FIG. 26 represents part of a specific architecture of one of the engines of FIGS. 24 and 25;

FIG. 27 shows in a first simple case a set of digital elements of a hardware component such as the ASIC of FIG. 1;

FIG. 28 shows in a second simple case a set of digital elements of a hardware component such as the ASIC of FIG. 1.

Figure 29:
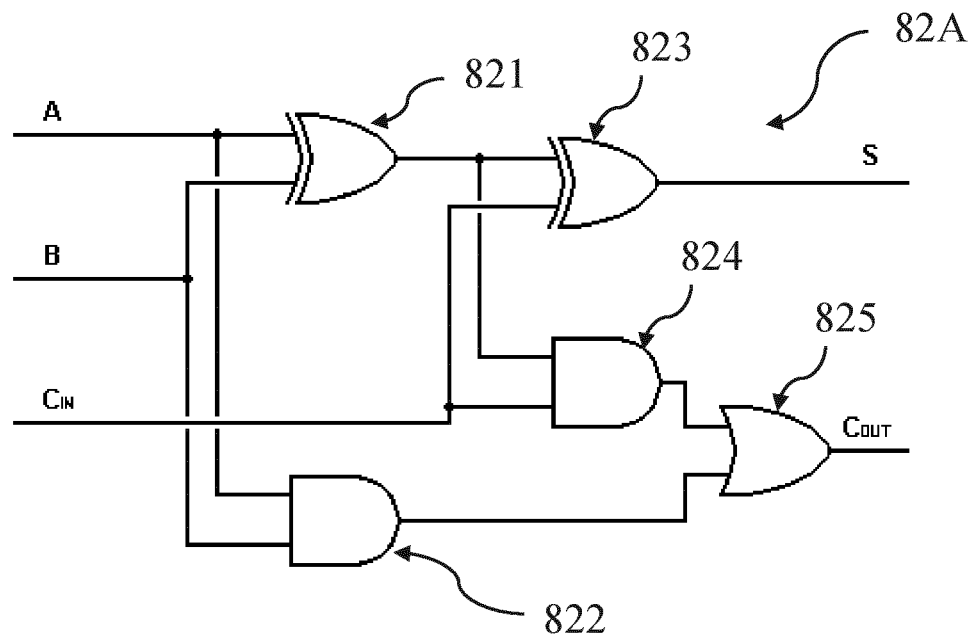

FIG. 29 shows in a third simple case a set of digital elements of a hardware component such as the ASIC of FIG. 1.

Figure 30:
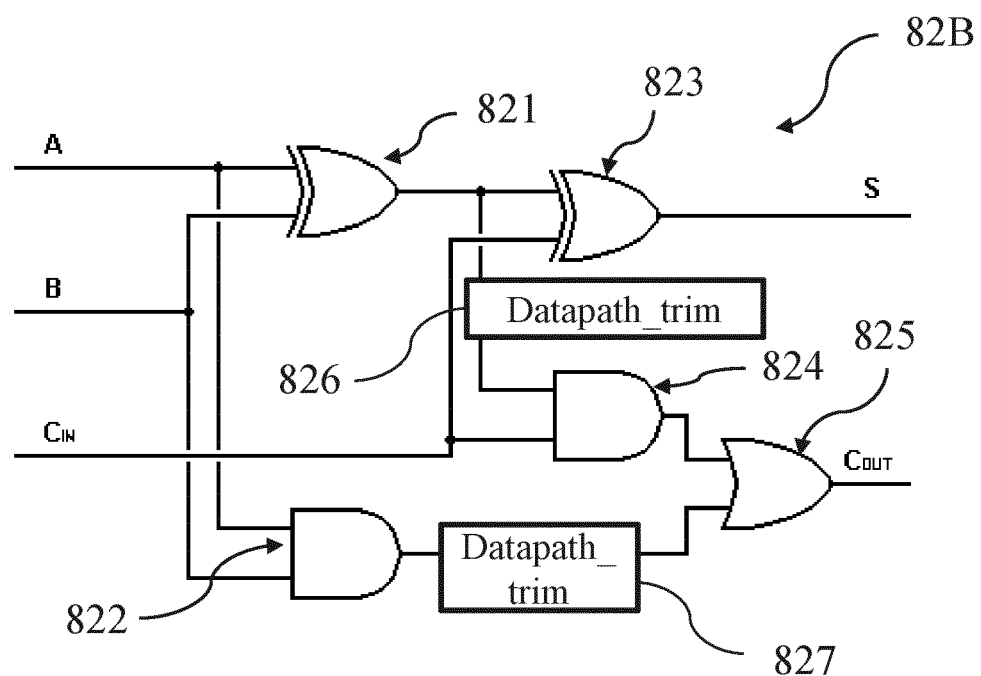

FIG. 30 shows in a fourth simple case a set of digital elements of a hardware component such as the ASIC of FIG. 1.

On the Figures, identical or similar elements are designated by the same references.

DESCRIPTION OF EMBODIMENTS

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure.

The terms "adapted" and "configured" are used in the present disclosure as broadly encompassing initial configuration, later adaptation or complementation of the present device, or any combination thereof alike, whether effected notably through material or firmware means. It should also be noted that terms such as "a" should be interpreted as not referring only to a single feature, but should also be considered to cover "at least one" or "one or more" of a particular feature.

The functions of various elements shown in the Figures and pertaining to the described hardware component may be provided through the use of dedicated hardware as well as firmware controlling appropriate hardware and/or a programmable logic device (PLD), such as e.g. an FPGA (for Field-Programmable Gate Array). Additionally, in case of e.g. firmware of PLDs, instructions and/or data enabling to perform associated and/or resulting functionalities may be stored on any processor-readable medium such as, e.g., an integrated circuit, a hard disk, a CD (Compact Disc), an optical disc such as a DVD (Digital Versatile Disc), a RAM (Random-Access Memory) or a ROM (Read-Only Memory).

It should be understood that multiple elements shown in the Figures may be implemented in various forms of hardware, firmware or combinations thereof.

The present disclosure will be described in reference to a particular functional embodiment of a device for implementing a camouflage of current traces generated by working an ASIC 1, as illustrated on FIG. 1. In the described implementation, that device is implemented through a digital system 10 which is part of the ASIC 1, together with an analog component 14 comprising a voltage regulator 15 and an oscillator 16, and cooperating with the digital system 10. The oscillator 16 is configured for regularly providing digital clock signals to the digital system 10 ("digital_clk").

The ASIC 1 includes an entry pad 21 for VCC power supply (VCC standing for Voltage Common Collector), i.e. positive supply voltage, feeding the analog component 14. It comprises also an entry pad 22 for VSS power supply (VSS standing for Voltage Source Supply), i.e. negative supply voltage (which may correspond to the ground), feeding the analog component 14 as well as the digital system 10. The analog component 14 has a power output 23 dedicated to providing VDD power supply (VDD standing for Voltage Drain to Drain) to the digital system 10.

In addition, the ASIC 1 is provided with a user interface pad 24, via which information can be entered and retrieved by a user. The user interface includes any means appropriate for entering or retrieving data, information or instructions, notably visual, tactile and/or audio capacities that can encompass any or several of the following means as well known by a person skilled in the art: a screen, a keyboard, a trackball, a touchpad, a touchscreen, a loudspeaker, a voice recognition system.

The digital system 10 includes a first digital module 11 adapted to provide values of voltage and frequency parameters to the analog component 14, respectively intended to the voltage regulator 15 and the oscillator 16. Those values can be appropriate for voltage and frequency modulations, and may take the form of respective delays dynamically communicated to the analog component 14. For example, the voltage delay for the voltage regulator 15 is expressed as a VDD trim ("VDD_TRIM"), while the frequency delay for the oscillator is expressed as a frequency trim ("FREQ_TRIM"). Those values may allow fine stepping of the VDD and frequency parameters. The first digital module 11 is also designated as an "ADGDET" engine, standing for an Adaptive Digital Glitch Detector module.

The first digital module 11 includes a datapath processor 17 and a generator of random numbers 18. The latter relies for example on a combination of a TRNG or True Random Number Generator, and of a LFSR or Linear-Feedback Shift Register. More details will be provided below on particular related implementations.

The digital system 10 further comprises a second digital module 12 adapted to jamming elementary datapath processing operations, and including a clock controller 13. The first digital module 11 is configured for dynamically communicating over time to the second digital module 12 values of datapath delays and clock skews, which may respectively be expressed as a datapath trim ("datapath_trim") and a clock skew trim ("Skew-trim").

The digital modules 11 and 12 are to be understood as functional entities rather than material, physically distinct, components. They can consequently be embodied either as grouped together in a same tangible and concrete component, as in the present example, or distributed into multiple such components. Also, each of those modules is possibly itself shared between at least two physical components. In addition, the modules are implemented in hardware, firmware, or any mixed form thereof as well. They are preferably embodied within at least one processor of the ASIC 1.

As visible from the above functionalities, the ASIC 1 is relevant to DVFS applications (standing for "Dynamic Voltage and Frequency Scaling"), and is suited to local supply voltage modulation, clock frequency modulation, datapath timing slack dynamic trimming and clock skew dynamic selection.

The whole digital system 10 may be modulated, or only part of it insofar as distinct power supplies associated with respectively distinct power domains are provided.

Figure 2:
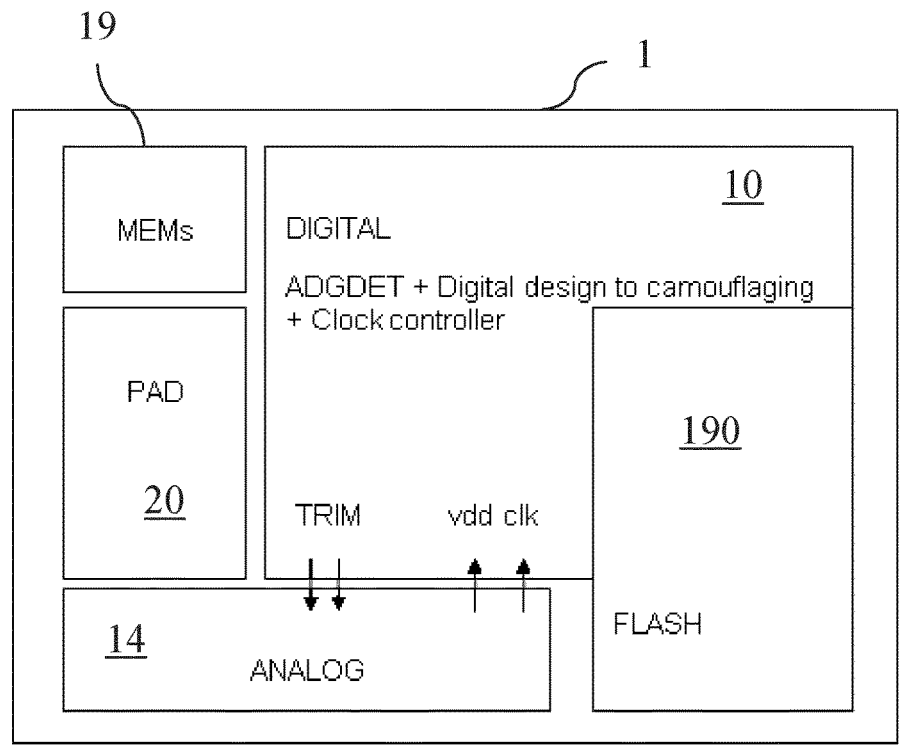
FIG. 2 represents a principle implementation of the ASIC of FIG. 1.

In an example implementation represented on FIG. 2, the ASIC 1 has its digital system 10 embodied as a large number of gates and an interconnect superimposed on the gates, which is compliant with a technology known as a Sea-of-Gates. In this implementation, the ASIC 1 further includes a set of pads 20 (including the pads 21, 22 and 24) and memories 19, further to a flash memory 190. The memories 19 can take the form of storage resources available from any kind of appropriate storage means, e.g. RAM or an EEPROM (Electrically-Erasable Programmable Read-Only Memory), possibly within an SSD (Solid-State Disk).

The memories 19, flash memory 190 and possibly other hard macros are subject to be modulated as part of the digital circuitry of the ASIC 1. Anyway, they may alternatively be on another power domain.

In variant implementations, the ASIC has a multi-power supply, and comprises a modulated digital part and a non-modulated digital part, involving two voltage regulators and two separate voltage domains.

The digital system 10 of the ASIC 1 comprises one or more sets of digital elements defining multiple operational datapaths. From those digital elements, a reference datapath is derived, which has a minimum duration corresponding to the longest of those operational datapaths. Such a reference datapath is determined from the digital elements and is integrated into the digital system 10. It may then be exploited for dynamically testing the ASIC 1 in relation with working conditions such as the adjusted VDD voltage and clock frequency, as well as with datapath delays and clock skew.

Test information entered into the reference datapath may include dynamically selected entry data (e.g. alternating 1 and 0 values over time clock cycles, possibly at each clock cycle, or testing both 0 and 1 values for each considered clock cycle), and check information retrieved from the reference datapath may include a current value of an output signal (e.g. 0 or 1). In some implementations, a single bit may be considered for the test information and the output signal. In other implementations, a complete word including multiple bits may be considered for the test information and the output signal.

Simple examples developed hereinafter will illustrate the above entities.

A first electronic circuit 81A represented on FIG. 27 comprises two AND gates 811 and 812 having a common input x and respective outputs Y1 and Y2. The circuit 81A also comprises two flip-flops 813 and 814 consisting in gated D latches, both being fed with a clock signal Clk. The flip-flops 813 and 814 further have respective data inputs D consisting in the output Y1 and Y2 of the AND gates 811 and 812. The complement output Q from the flip-flop 813 and the output Q from the flip-flop 814 (noted y2) are directed to inputs of a further AND gate 816, having an output z. Also, the complement output Q from the flip-flop 813 is wired to a second input of the AND gate 811. The circuit 81A further includes an OR gate 815, the inputs of which are originating from the output Q of the flip-flop 813 (noted y1) and the output Q of the flip-flop 814 (y2). The output of the OR gate 815 makes a second entry of the AND gate 812.

The circuit 81A forms a number of operational datapaths, including (starting from the clock signal Clk):
flip-flop 813/AND gate 816;
flip-flop 813/AND gate 811;
flip-flop 814/AND gate 816;
flip-flop 814/OR gate 815/AND gate 812;
flip-flop 813/OR gate 815/AND gate 812.

The longest of all those possible operational datapaths therefore appears to correspond to any of the two latest ones, and to amount to a series of a flip-flop, an OR gate and an AND gate.

A proper reference datapath should thus have a minimum duration corresponding to that series. For determining it, the structures of the flip-flops 813 and 184 are taken into account. Typically, for example, a related gated D latch corresponds to a longest internal datapath of three NAND gates, or of successively one AND gate and two NOR gates. This makes as a whole a series of six logic gates for the longest operational datapath of the circuit 81A.

Accordingly, the associated reference datapath may include six logic gates, which may be e.g. six chained inverters (i.e. NOT gates). Since it is desirable that the reference datapath have a duration a bit longer than the longest operational datapath of the circuit 81A, for taking a safety margin into account, the reference datapath may be formed with a series of seven chained inverters, rather than six. This is all the more appropriate for that embodiment with inverters, since the effective duration corresponding to an inverter may be a bit shorter than the effective duration corresponding to OR, AND, NOR or NAND gates.

In another implementation, the reference datapath is made more similar to the longest operational datapath of the circuit 81A. This can enable to get enhanced precision with a step-by-step dynamic testing of the circuit 81A. Thus, the reference datapath may be formed of a series of chained logic gates comprising successively: three NAND gates (corresponding to the flip-flop 813 or 814), an OR gate (corresponding to the OR gate 815) and an AND gate (corresponding to the AND gate 812).

One of the entries of those two-input logic gates may be set to a predefined value, the latter being chosen so that the output of the concerned gate is significant. For example, one of the entries of the logic gates may be repeatedly fed with: 1 for the NAND gates, 0 for the OR gate and 0 for the AND gate.

As above, a further logic gate may be added for taking a safety margin into account, e.g. a further OR gate. The further logic gate may be positioned downstream in the series of chained logic gates of the reference datapath, which offers a way to absorb cumulated inaccuracies, uncontrolled offsets and/or delays in the chain of operations.

In a variant example, the reference datapath does not reproduce exactly the nature of the logic gates in the longest operational datapath of the circuit 81A, but includes logic gates having respectively similar individual durations. It deserves noting that the selection of a logic gate in the reference datapath corresponding to a logic gate in the longest operational datapath of the circuit 81A while being distinct thereof, may depend on the used underlying technology (a typical propagation delay for a given logic gate ranging from a few picoseconds to 10 ns as a function of the used technology). For example, a NAND gate of the longest operational datapath may be reflected by an OR gate in the reference datapath, and an AND gate by a NOR gate. In this respect, the reference datapath may be formed of a series of chained logic gates comprising successively: four OR gates (corresponding to the flip-flop 813 or 814 and the OR gate 815) and a NOR gate (corresponding to the AND gate 812). As above, a further logic gate may be added for taking a safety margin into account, e.g. a further NOR gate.

A second electronic circuit 81B represented on FIG. 28 is similar to the first circuit 81A and comprises identical flip-flops and logic gates. However, it further includes two types of elements enabling to introduce delays: one of them applied to the clock signal Clk, and the other one applied to data inputs or outputs.

More precisely:
- a module 817 is introducing a clock skew (application of skew trimming) upstream of the two flip-flops 813 and 814;
- a module 818 is introducing a delay in the data input x of the AND gate 811 (application of datapath trimming);
- a module 819 is introducing a delay in the data inputs of the OR gate 815 (application of datapath trimming), respectively originating from the Q outputs of the flip-flops 813 and 814.

Those modules 817, 818 and 819 may be exploited for increasing jamming in signals emitted by the electronic circuit 81B, e.g. through using random or pseudo-random delay values. The introduced delays may be reflected in the reference datapath, insofar as they impact the longest operational datapath. In the present example, the module 818 has no effect on the longest operational datapath of the circuit 81B. By contrast, the latter is concerned by both modules 817 and 819.

Accordingly, in advantageous achievements, the reference datapath is determined as developed hereinabove about the circuit 81A, while being completed with two delay modules arranged along the constructed series of selected logic gates, positioned in a way reflecting the positions of the modules 817 and 819 along the longest operational datapath, and being configured for introducing delays identical or similar to the delays respectively applied by the modules 817 and 819.

For example, the reference datapath being formed of a series of seven chained inverters, a module for introducing a clock skew is arranged upstream of the first inverter, and a module for introducing a datapath delay is arranged between the third and the fourth inverter (in the absence of a further inverter relevant to a security margin, or if such an inverter is positioned downstream).

Hinging on the other examples above regarding the circuit 81A, the reference datapath associated with the circuit 81B is completed with a module for introducing a clock skew upstream of the first logic gate, and a module for introducing a datapath delay between the third and the fourth logic gate (in the absence of a further logic gate relevant to a security margin, or if such a further logic gate is positioned downstream).

A third electronic circuit 82A represented on FIG. 29 further illustrates principles in constructing and implementing the reference datapath. The electronic circuit 82A comprises a XOR gate 821 and an AND gate 822, both fed with common inputs A and B.

It also comprises another XOR gate 823 and another AND gate 824, each of them having a first input wired to the output of the XOR gate 821 and a second input receiving an entry signal $C_{IN}$. The output of the XOR gate 821 is providing a signal S, while the output of the AND gate 824 is connected to an input of an OR gate 825, the other input of which is provided by the output of the AND gate 822. The OR gate 825 is yielding a signal $C_{OUT}$.

The third electronic circuit 82A comprises multiple operational datapaths, including:
- XOR gate 821/XOR gate 823;
- AND gate 822/OR gate 825;
- AND gate 824/OR gate 825;
- XOR gate 821/AND gate 824/OR gate 825.

The longest of the operational datapaths corresponds to the latest chain, having three successive XOR, AND and OR logic gates.

Accordingly, a reference datapath may be determined as a series of at least three logic gates, such as e.g. three inverters. It is however advantageous to provide for a further logic gate so as to take a security margin into account. The reference datapath may thus be formed of a series of four chained inverters.

In another implementation, the reference datapath is as close as possible to the longest operational datapath of the electronic circuit 82A, and comprises a series of successively a XOR gate, an AND gate and an OR gate. Advantageously, a further logic gate is added, so as to take a security margin into account. The further logic gate may be e.g. an inverter, or an OR gate.

One of the entries of those two-input logic gates may be set to a predefined value, the latter being chosen so that the output of the concerned gate is significant. For example, one of the entries of the logic gates may be repeatedly fed with: 0 or 1 for the XOR gate, 0 for the AND gate and 0 for the OR gate.

In a variant implementation, the reference datapath comprises at least one logic gate distinct from a mimicked gate of the longest operational datapath, while having a duration close to the duration of that mimicked gate. For example, the reference datapath is formed from a series of three chained XOR gates, to which a further XOR gate may be added to take a security margin into account.

A fourth electronic circuit 82B represented on FIG. 30 is derived from the third circuit 82A, by adding two elements enabling to introduce delays in data inputs (application of datapath trimming):

a module 826 is introducing a delay in the data input of the AND gate 824 provided by the data output of the XOR gate 821;

a module 827 is introducing a delay in the data output of the AND gate 822 providing the data input of the OR gate 825 (alternatively, a delay may be applied to the concerned data input of the OR gate 825).

Those modules 826 and 827 may be exploited for adding jamming in signals emitted by the electronic circuit 82B, e.g. through using random or pseudo-random delay values. The introduced delays may be reflected in the reference datapath, insofar as they impact the longest operational datapath. In the present example, the module 827 has no effect on the longest operational datapath of the circuit 82B. By contrast, the latter is impacted by the module 826.

Accordingly, in advantageous achievements, the reference datapath is determined as developed hereinabove about the circuit 82A, while being completed with a delay module arranged along the constructed series of selected logic gates, positioned in a way reflecting the position of the module 826 along the longest operational datapath, and being configured for introducing delays identical or similar to the delays applied by the module 826.

For example, the reference datapath being formed of a series of four chained inverters, a module for introducing a datapath delay is arranged between the first and the second inverter.

Hinging on the other examples above regarding the circuit 82A, the reference datapath for the circuit 82B is completed with a module for introducing a datapath delay between the first and the second logic gates (in the absence of a further logic gate relevant to a security margin, or if such a further logic gate is positioned downstream).

The operations of the ASIC 1 will now be detailed, by successively focusing on the four above-mentioned jamming aspects: voltage regulator modulation, frequency modulation, datapath trimming modulation and clock skewing modulation. In what follows, the functional parts of the ASIC 1 mainly involved in the four jamming aspects are successively pointed out on the Figures by being italicized.

Also, the "critical path" referred to hereinafter means a path corresponding to the reference datapath, while being subject to datapath delays and/or clock skew, which leads to a failure behavior.

Figure 3:
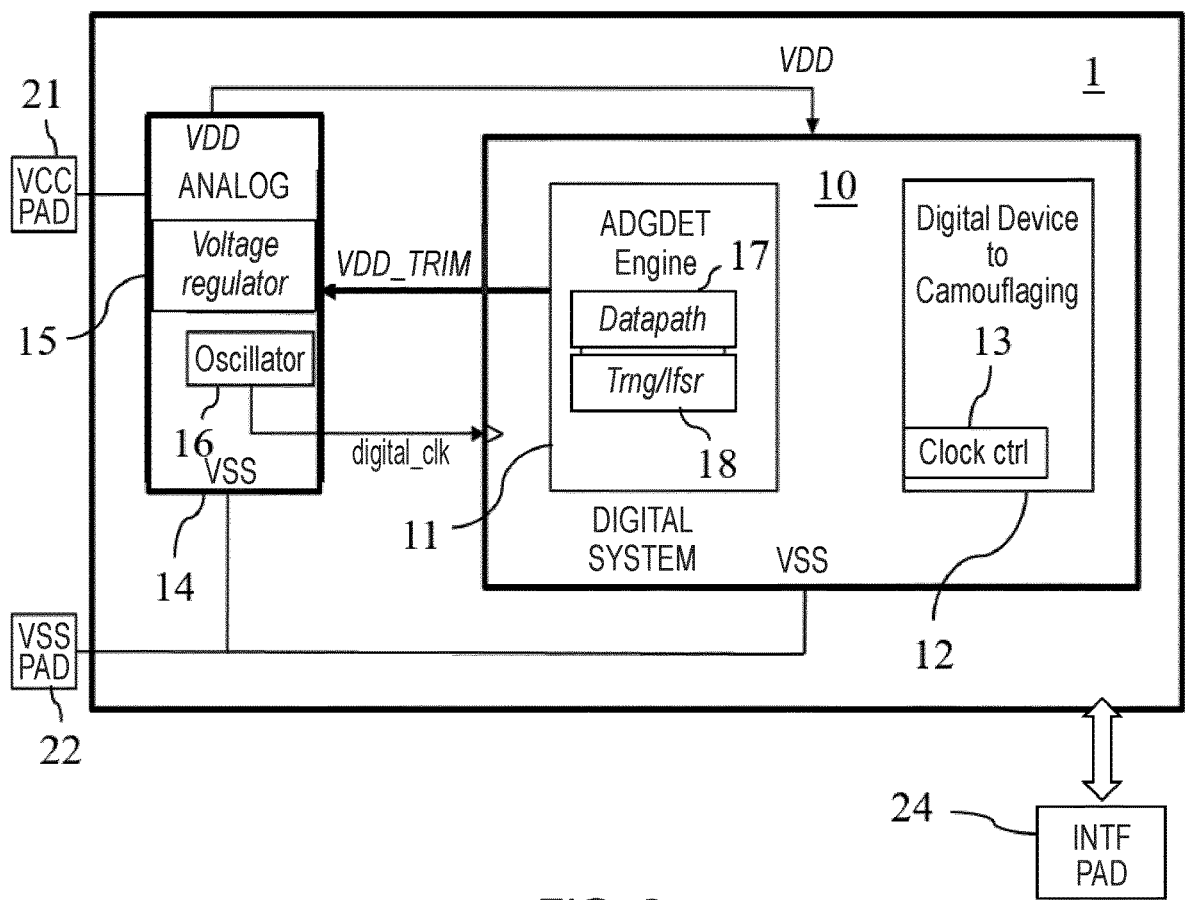
FIG. 3 shows the principle diagram of FIG. 1 while pointing out a first aspect of the hardware component, in relation with voltage regulator modulation.

As regards voltage regulator modulation, as visible on FIG. 3, it involves the voltage regulator 15 being controlled by the first digital module 11. More precisely, in execution, the random number generator 18 generates a target voltage value between minimum and maximum bounds of the voltage, and the first digital module 11 increments or decrements the voltage towards the target value. The first digital module 11 determines through the datapath processor 17 along the reference datapath whether a critical path is reached before the minimum voltage bound. If yes, the datapath processing with the current voltage value is stopped and a higher voltage level (which corresponds e.g. to a previous VDD_TRIM value) is adopted. If no, the datapath processing with the current voltage value is stopped when arriving at the target voltage value. A new random value is then generated for determining the next target voltage level.

Figure 4:
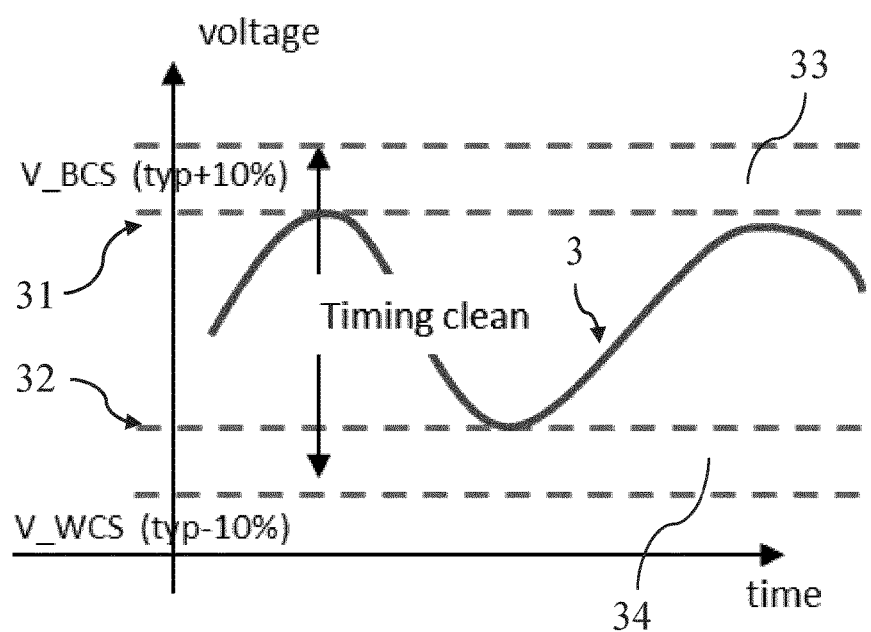
FIG. 4 illustrates time evolution of the voltage in relation with the first aspect of FIG. 3.

A purely schematic view of the time evolution of the voltage, as represented with the curve 3 on FIG. 4, shows modulations between an upper bound 31 that corresponds to a BCS or Best Case Scenario, and a lower bound 32 that corresponds to a WCS or Worst Case Scenario (since a lower power tends to induce errors). The bounds 31 and 32 are depending on limit electrical ratings, and are for example derived from a typical operating voltage mode by respectively adding and subtracting 10% to and from a typical average voltage value. Also, a predefined security margin 33, 34 may be respectively subtracted from and added to the values resulting from those percentage adjustments, so as to obtain the effective upper bound 31 and lower bound 32.

A large range of voltage scaling may be available in controlling the analog voltage regulator 15 by the digital system 10, which can rely on random number generation by the generator 18 within safe controlled limits (bounds 31 and 32). Also, the digital system 10 may be adapted to calibrate and monitor dynamically the voltage supply, thereby hinging on a control loop.

Figure 5A:
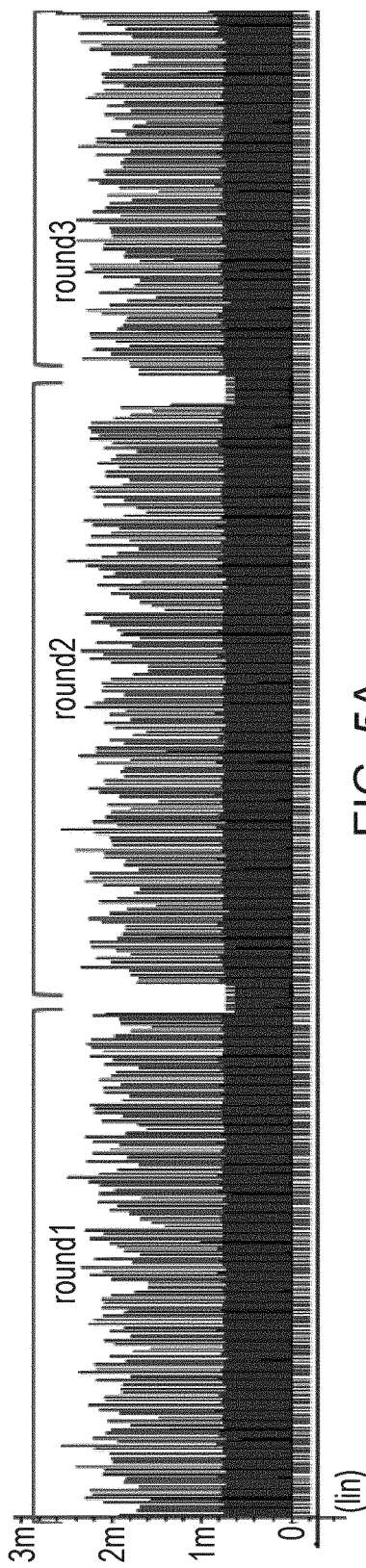
FIG. 5A represents a current signature of a typical operating mode without voltage modulation.
Figure 5B:
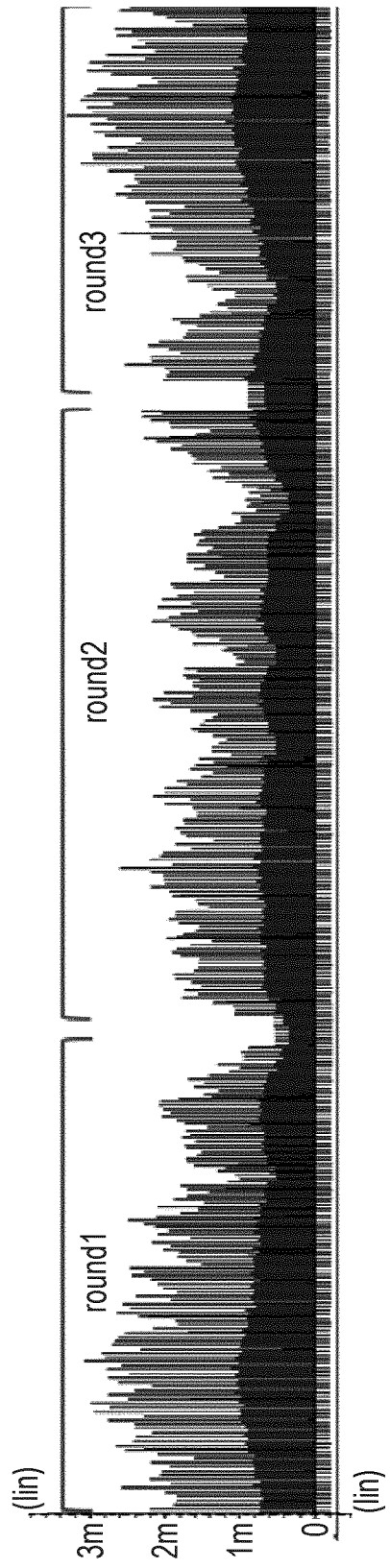
FIG. 5B represents an effect of supply voltage modulation on current signature, as obtained with the hardware component of FIG. 1 in relation with the voltage curve of FIG. 4.

Effects of voltage modulation can be quite apparent, as visible on FIG. 5A without voltage modulation and FIG. 5B in presence of a supply voltage modulation (current signature over time). It will be appreciated that in this respect, a false activity can be emulated, while a true activity can be hidden.

As will be clearer when explaining the associated processing model, supply voltages quite close to the minimum bound 32 can be attained (with longer processing delays), which offers an expanded range of available voltage values.

Figure 6:
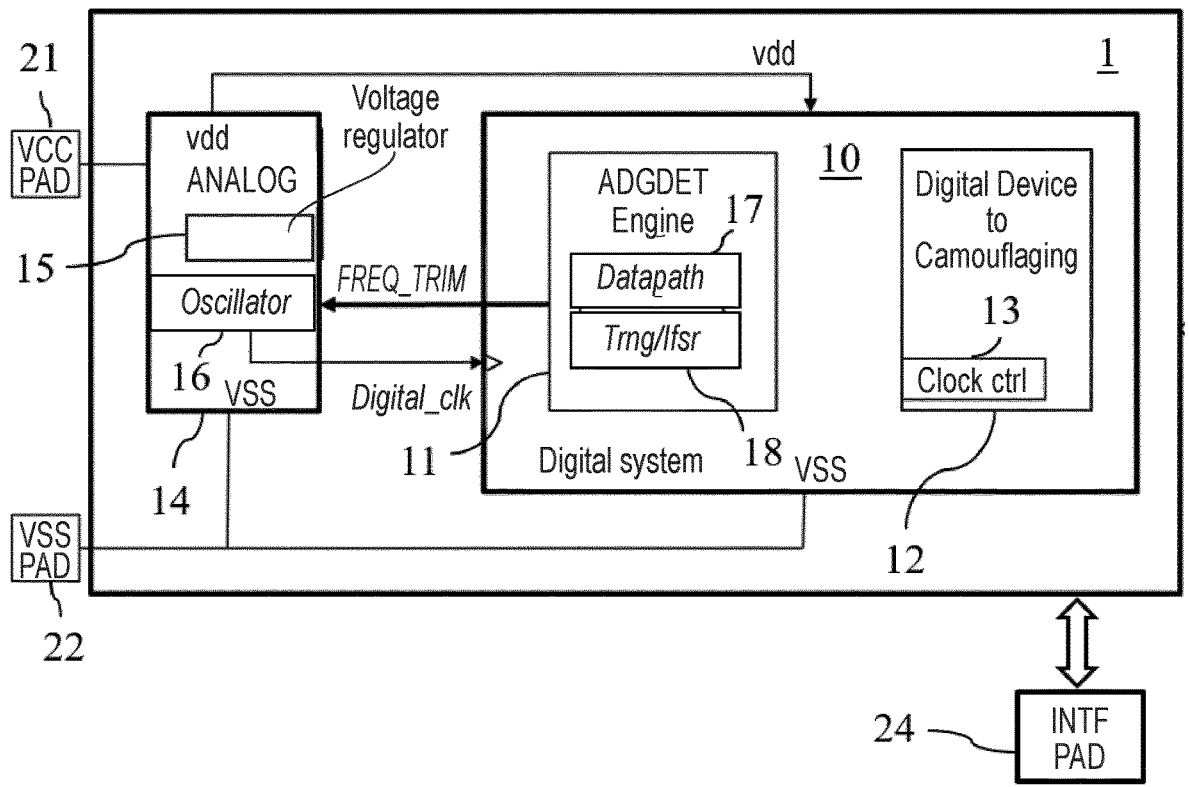
FIG. 6 shows the principle diagram of FIG. 1 while pointing out a second aspect of the hardware component, in relation with frequency modulation.

Turning now to frequency modulation, as visible on FIG. 6, it involves the oscillator 16 being controlled by the first digital module 11. More precisely, in execution, the random number generator 18 generates a target frequency value between minimum and maximum bounds of the frequency, and the first digital module 11 increments or decrements the frequency towards the target frequency. The first digital module 11 determines through the datapath processor 17 along the reference datapath whether a critical path is reached before the maximum frequency bound. If yes, the datapath processing with the current frequency value is stopped and a lower frequency level (which corresponds e.g. to a previous FREQ_TRIM value) is adopted. If no, the datapath processing with the current frequency value is stopped when reaching the target frequency value. A new random value is then generated for determining the next target frequency level.

Figure 7:
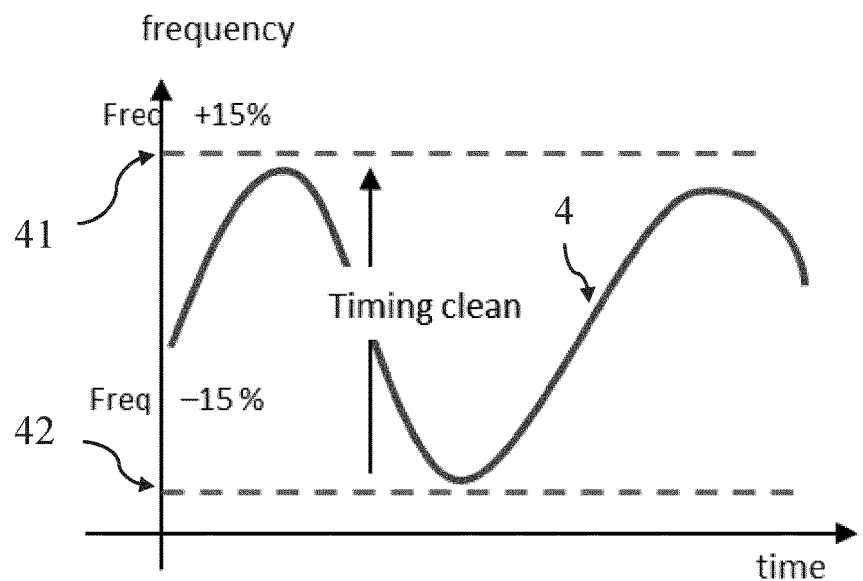
FIG. 7 illustrates time evolution of the frequency in relation with the second aspect of FIG. 6.

A purely schematic view of the time evolution of the frequency, as represented with the curve 4 on FIG. 7, shows modulations between an upper bound 41 that corresponds to a WCS or Worst Case Scenario, and a lower bound 42 that corresponds to a BCS or Best Case Scenario (since a higher frequency tends to induce errors). The bounds 41 and 42 are for example derived from a typical operating frequency mode by respectively adding and subtracting 15% to and from a typical average frequency value. Also, a predefined security margin (not represented) may be respectively subtracted from and added to the values resulting from those percentage adjustments, so as to obtain the effective upper bound 41 and lower bound 42.

A large range of frequency scaling together with fine variations may be available in controlling the analog oscillator 16 by the digital system 10, which can rely on random number generation by the generator 18 within safe controlled limits (bounds 41 and 42). Also, the digital system 10 may be adapted to calibrate and monitor dynamically the frequency, thereby hinging on a control loop.

Figure 8A:
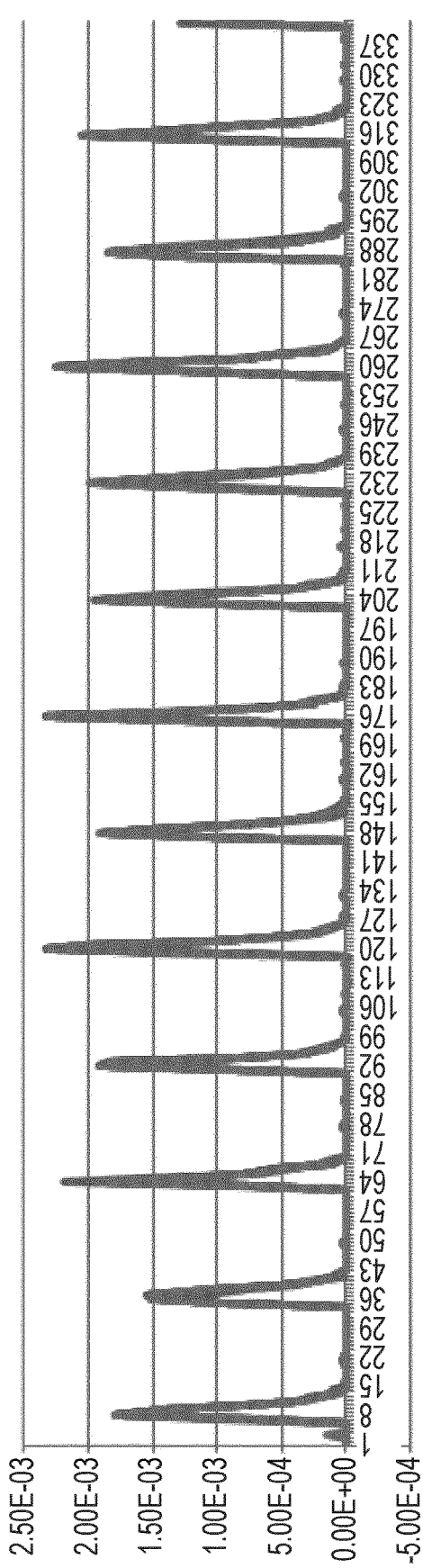
FIG. 8A represents a current signature of a typical operating mode without frequency modulation.
Figure 8B:
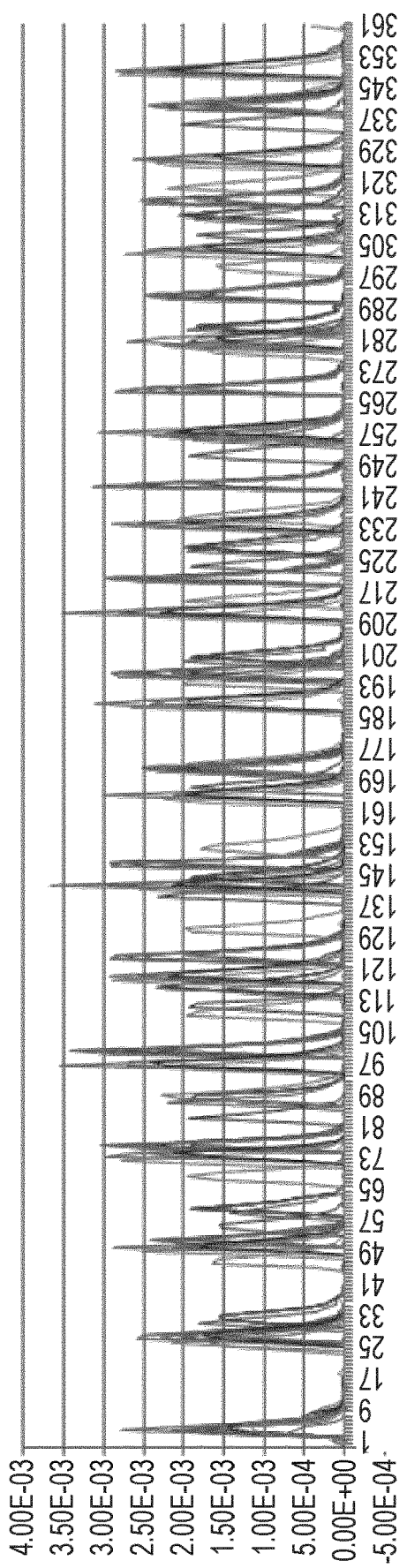
FIG. 8B represents an effect of frequency modulation on current signature, as obtained with the hardware component of FIG. 1 in relation with the frequency curve of FIG. 7.

Effects of frequency modulation can be quite apparent, as visible on FIG. 8A without frequency modulation and FIG. 8B in presence of a frequency modulation (current signature over time, several series being represented on FIG. 8B). It will be appreciated that in this respect, the easiness of superposing traces and synchronization can be reduced, and the amplitude of frequency variations can be chosen so as to get sufficient desynchronization for efficient countermeasure to side-channel attacks.

As will be clearer when explaining the associated processing model, frequencies quite close to the maximum bound 41 can be attained, which offers an expanded range of available frequency values.

Figure 9:
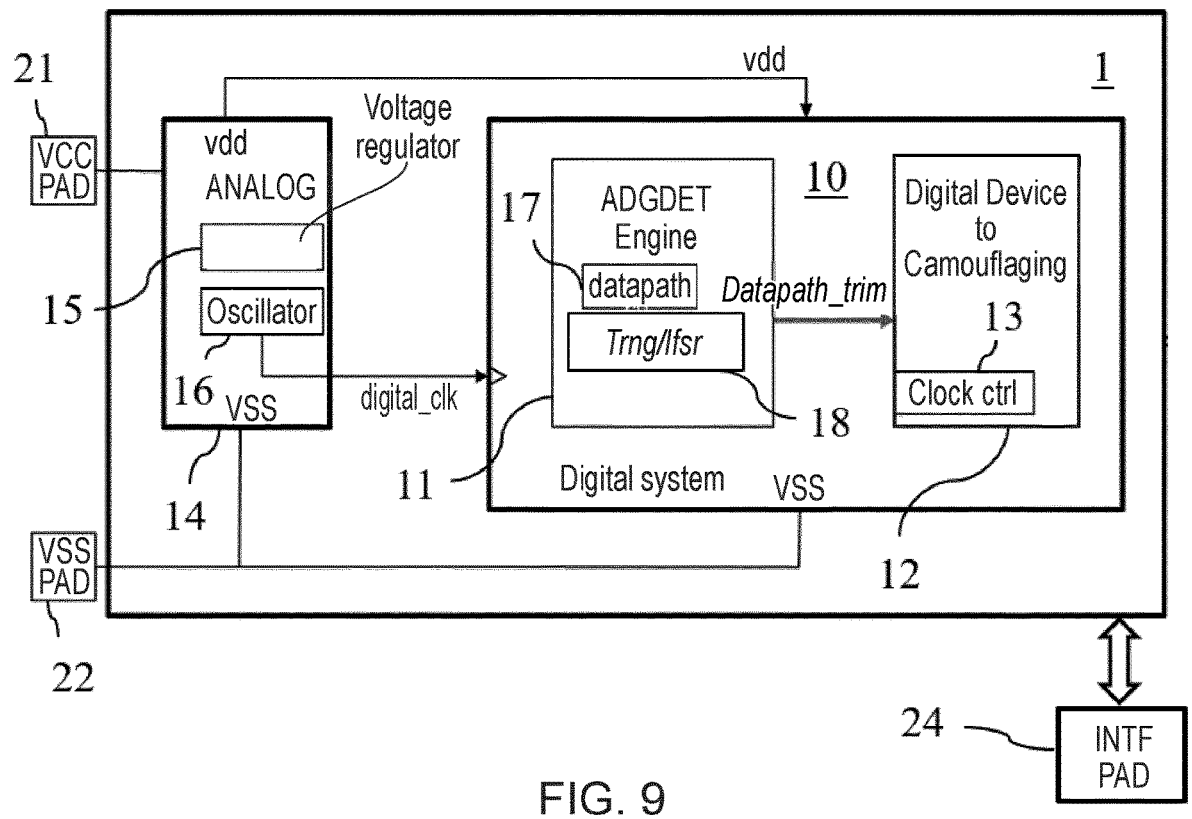
FIG. 9 shows the principle diagram of FIG. 1 while pointing out a third aspect of the hardware component, in relation with datapath trimming modulation.

Datapath trimming modulation, pointed out on FIG. 9, involves the random number generator 18 of the first digital module 11 together with the communication of datapath trim values to the second digital module 12.

Taking account of the datapath trim values by the second digital module 12 has the effect of controlling clock skew distribution, since each datapath trim may be used for hard-coding a specific sequence of the clock distribution. This may be programmable through a LUT (Look-Up Table). Also, the datapath trim values may be changed at each clock cycle or every N cycles, and stopped at any time. In this respect, the timing may be guaranteed safe during usage.

It can be noted that the clock skewing modulation may be fully disconnected from the first digital module 11, while offering a potentially efficient feature for fighting against an analysis of current traces, in combination with previously described voltage and/or frequency modulation.

Figure 10:
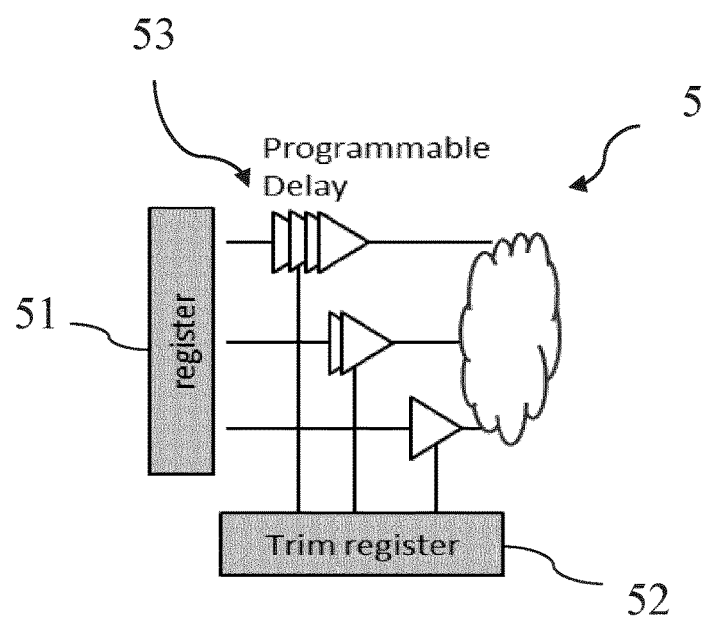
FIG. 10 is a principle illustration of datapath trimming implementation in relation with FIG. 9, as applied with the hardware component of FIG. 1.

A datapath trimming implementation 5 in the second digital module 12 is for example as follows, in relation with FIG. 10. A register 51 loading current bits of operands is crossed with a trim register 52 giving respective bit-corresponding delays 53, which are received via the datapath trim values. The latter can be changed at any clock cycle. In addition, a specific bit or group of bits can be selected to create a delay in an independent way. As regards the datapath trim values, they may be determined by the first digital module 11 based on the TRNG and/or LFSR of the generator 18.

Effects of datapath timing modulation on a current signature may include changing the mid-range current profile of combinational parts and reducing the timing slack. In respect of the latter, a timing margin may be taken for sake of safety.

Figure 11:
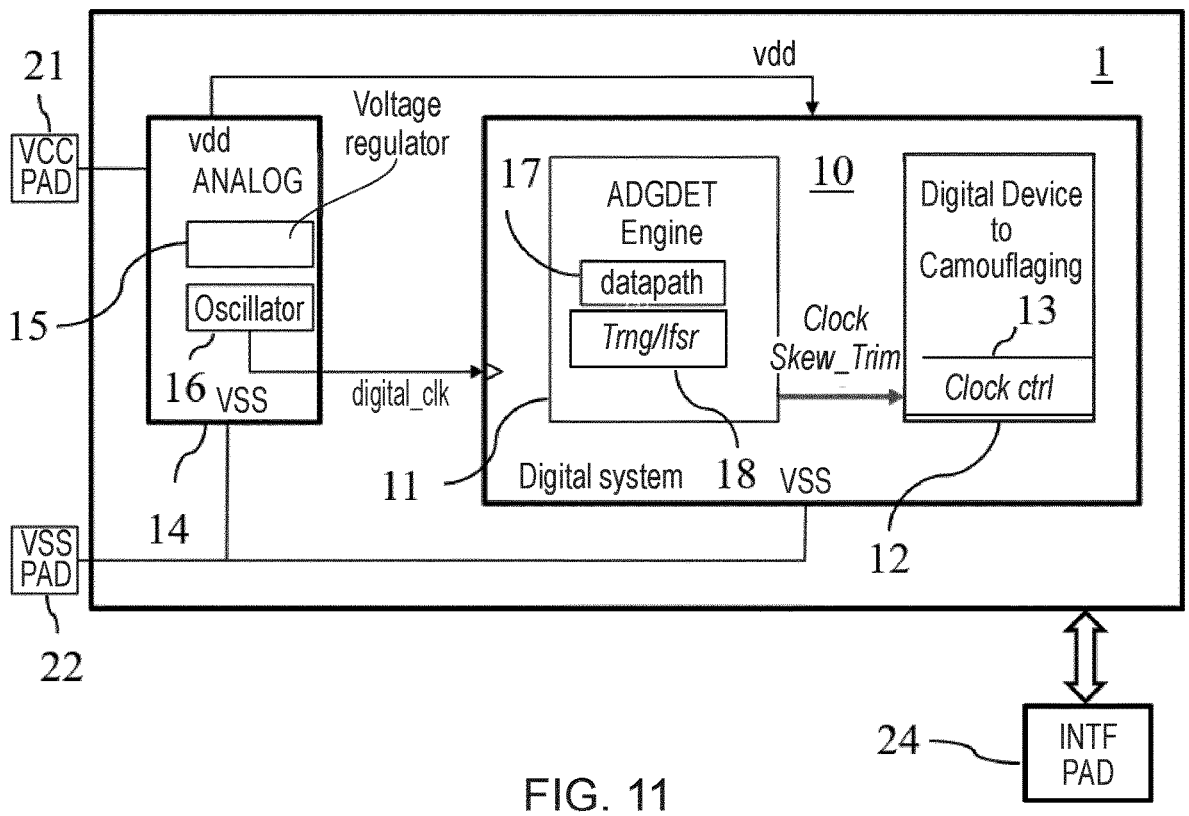
FIG. 11 shows the principle diagram of FIG. 1 while pointing out a fourth aspect of the hardware component, in relation with clock skewing modulation.

Clock skewing modulation, pointed out on FIG. 11, involves the random number generator 18 of the first digital module 11 together with the communication of clock skew trim values to the second digital module 12.

Taking account of the clock skew trim values by the second digital module 12 has the effect of controlling clock skew distribution, since each clock skew trim may be used for hard-coding a specific sequence of the clock distribution. This may be programmable through a LUT. Also, the clock skew trim values may be changed at each clock cycle or every N cycles, and stopped at any time. In this respect, the timing may be guaranteed safe during usage.

It can be noted as above that the clock skewing modulation may be fully disconnected from the first digital module 11, while offering a potentially efficient feature for fighting against an analysis of current traces, in combination with previously described voltage and/or frequency modulation.

Figure 12:
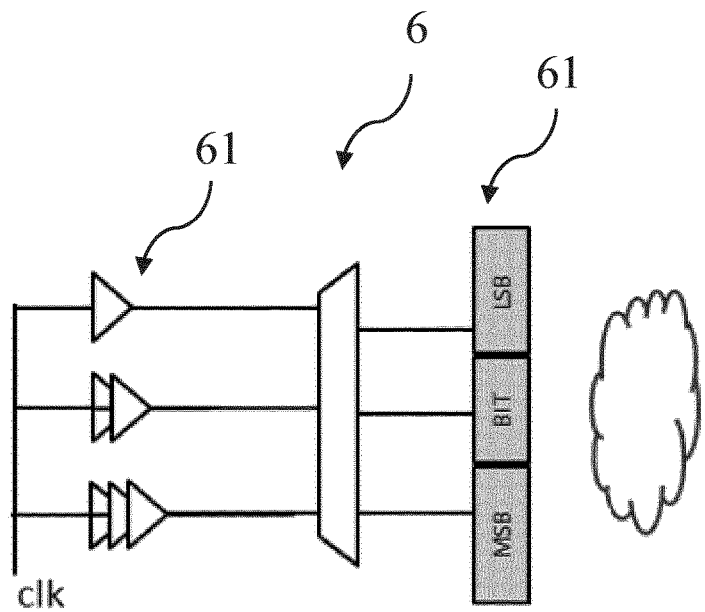
FIG. 12 is a principle illustration of clock skewing implementation in relation with FIG. 11, as applied with the hardware component of FIG. 1.

A clock skew trimming implementation 6 in the second digital module 12 is for example as follows, in relation with FIG. 12. A register 61 loading current bits of operands is fed with respective bit-corresponding delays 62, which are received via the clock skew trim values—the operand register 61 being e.g. clocked by several clocks having programmable skews. The clock skew may be changed at any clock cycle. As regards the clock skew trim values, they may be determined by the first digital module 11 based on the TRNG and/or the LFSR of the generator 18. It can be observed that introducing delays for LSB (Least Significant Bits) may have more impact than for MSB (Most Significant Bits).

Effects of clock skew timing modulation on a current signature may include increasing an average value while reducing peak values, changing a current trace in function of targeted registers and changing values, changing a current profile of combinational parts, reducing a slope of peak current, and reducing the timing slack. In respect of the latter, a timing margin may be taken for sake of safety.

The ASIC 1 may offer a large range of scenarios, by combining voltage and frequency modulations within authorized bounds. In some implementations, an adequate threshold value is used so as to force modulations controlled by the first digital module 11 within a restricted region of voltage and frequency.

Figure 13A:
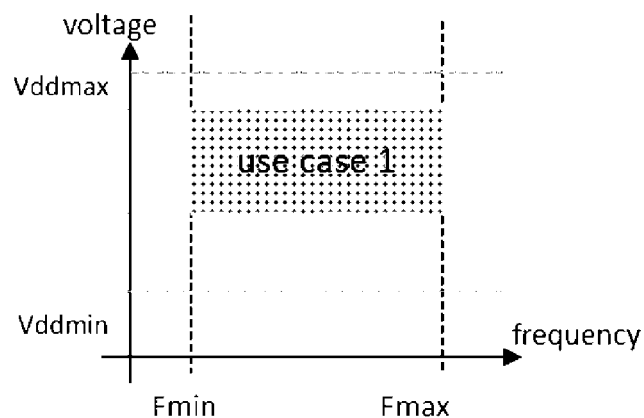
FIG. 13A illustrates a first mode of combined voltage and frequency modulation, as implemented with the hardware component of FIG. 1.
Figure 13B:
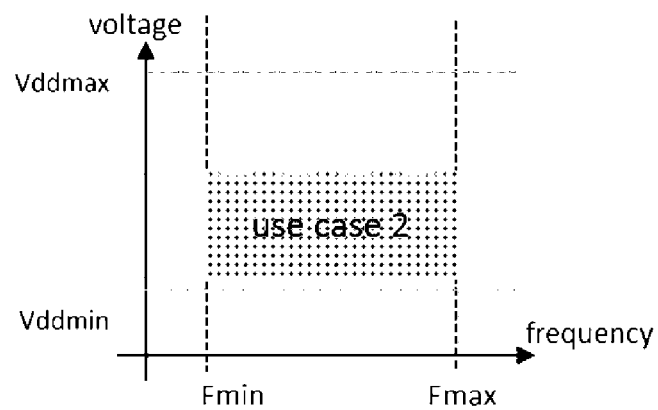
FIG. 13B illustrates a second mode of combined voltage and frequency modulation, as implemented with the hardware component of FIG. 1.
Figure 13C:
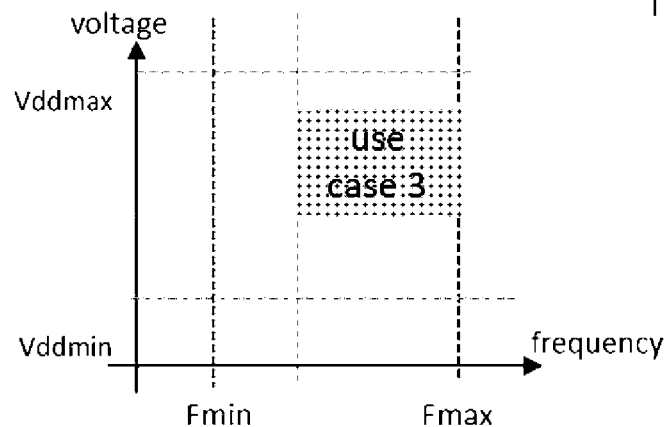
FIG. 13C illustrates a third mode of combined voltage and frequency modulation, as implemented with the hardware component of FIG. 1.
Figure 13D:
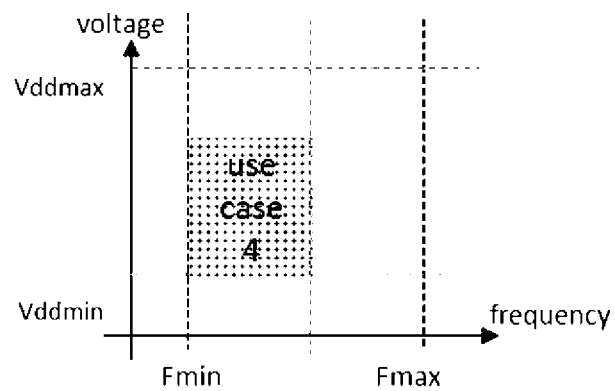
FIG. 13D illustrates a fourth mode of combined voltage and frequency modulation, as implemented with the hardware component of FIG. 1.

In particular:
a first use case (FIG. 13A) involves a maximum frequency spreading with a high range of power supply,
a second use case (FIG. 13B) involves a maximum frequency spreading with a low range of power supply,
a third use case (FIG. 13C) involves a high range of frequencies with a high range of power supply,
a fourth use case (FIG. 13D) involves a low range of frequencies with a low range of power supply.

Figure 14:
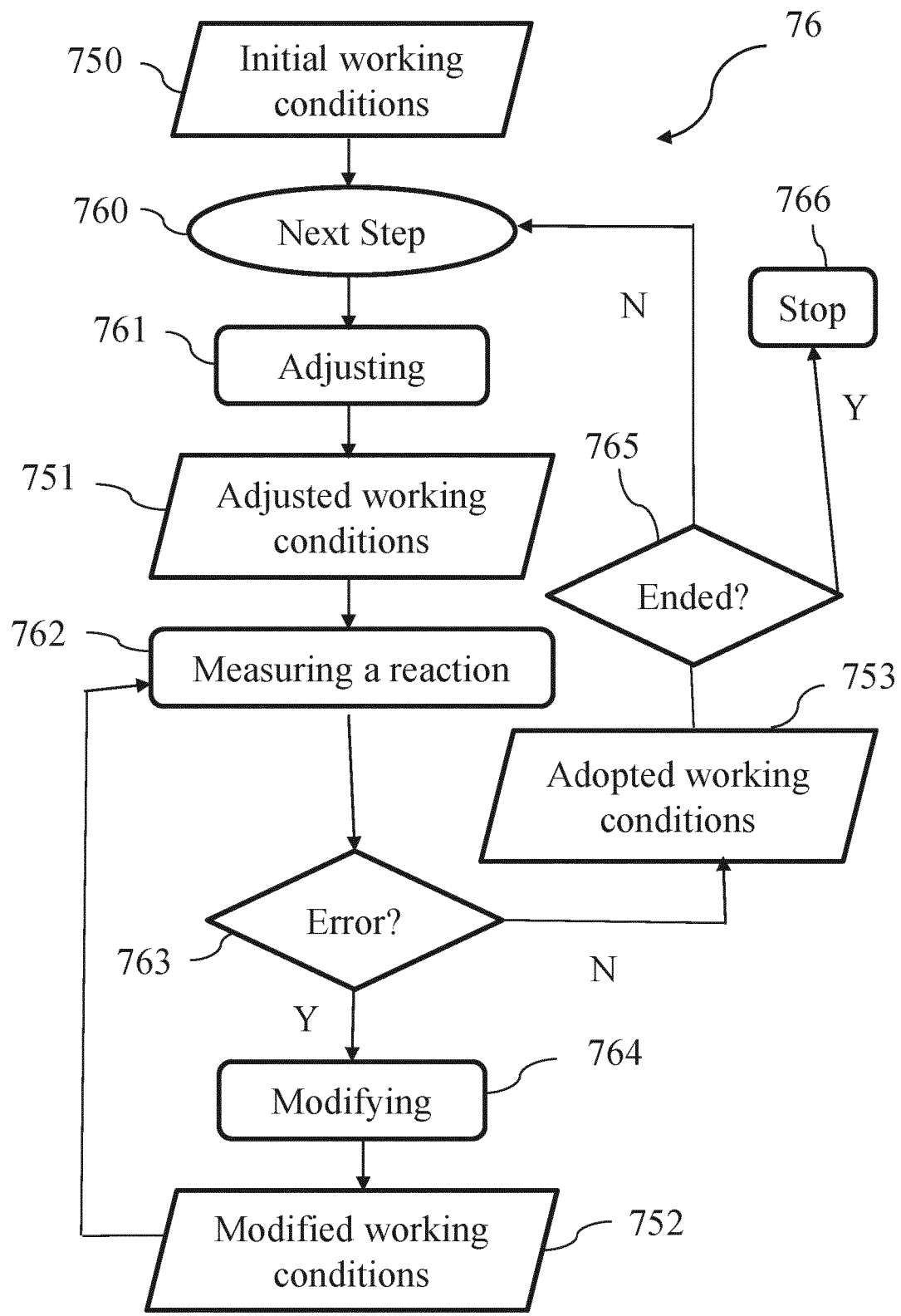
FIG. 14 is a flow chart showing successive steps executed with the hardware component of FIG. 1.

In operation, as illustrated on FIG. 14, the ASIC 1 (more precisely the digital system 10) may proceed as follows in carrying out a method 76 for a camouflage of current traces generated by the ASIC 1.

Initial working conditions 750 such as the supply voltage and/or the clock frequency being set, e.g. at nominal values, a next working condition step 760 is triggered. The next working condition step 760 is dedicated to producing next values of the working conditions. It may correspond notably to a next clock cycle. In variant implementations, it may correspond to one or more clock cycles, the number of clock cycles being e.g. determined in a random way.

Once the next working condition step 760 is triggered, the working conditions are adjusted at stage 761 to adjusted working conditions 751. The latter may be determined e.g. by a random process, or by an iterative progression towards target values as developed below.

At stage 762, a reaction of the ASIC 1 to the adjusted working conditions 751 is measured along a reference datapath, which has a minimum duration corresponding to at least the longest of the operational datapaths in the digital system 10 (more precisely in the first digital module 11).

This is subject to a test at stage 763: if an error is detected, then the working conditions are modified at stage 764 to modified working conditions 752, which are submitted in their turn to measuring a reaction of the ASIC 1 along the reference datapath through a loop back process. Otherwise, if no error is detected at stage 763, the current working conditions (whether adjusted or modified) are kept as adopted working conditions 753 and exploited at the considered step for executing the effective operational datapaths with ASIC 1.

Optionally, as long as the jamming operations associated with ongoing computations are not over (check stage 765), the next working condition step 760 is triggered, and the stages above are iteratively repeated as a loop flow. Once those operations are ended, the process is stopped (stage 766).

Operations of the ASIC 1 will be better understood by describing a related FSM 7, as illustrated on FIG. 15, which FSM 7 comprises two sub-model parts (or sub-FSMs) running independently from each other and being enabled in an autonomous way: a first sub-FSM 71 devoted to supply voltage modulation and a second sub-FSM 72 devoted to clock frequency modulation. The FSM 7 may be exploited for calibration (with the reference datapath) before effective running (with the operational datapaths), so as to define appropriate safe successive supply voltage and clock frequency values. It will be appreciated that the FSM 7 may include additional sub-model parts (i.e. sub-FSMs) devoted to modulation of other working conditions than voltage modulation and clock frequency modulation.

The sub-FSMs 71 and 72 are initiated from a common reference set 70 of typical working values (which may be expressed through the voltage VDD_TRIM and the frequency FREQ_TRIM). When enabled, respective cycle operation stages 710 and 720 are performed for the voltage (VS) and the frequency (FS).

Figure 16:
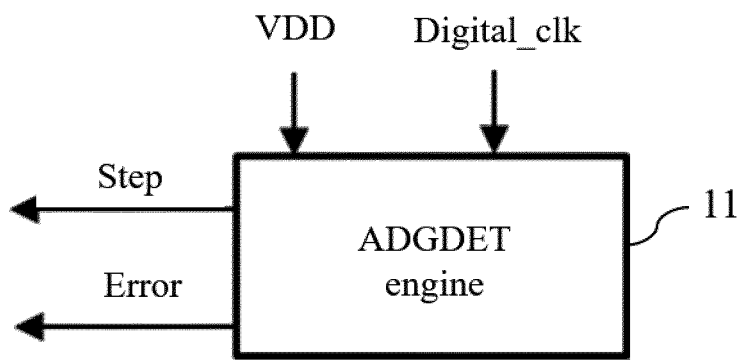
FIG. 16 is a block representation of an engine corresponding to the computation model of FIG. 15, and of a related flow chart.

The sub-FSMs 71 and 72 will be separately detailed below. Both are relying on similar functionalities of the first digital module 11 and have combined effects, even though running independently, as visible on FIG. 16: current values of the supply voltage VDD and of the clock frequency Digital_clk are obtained, and a "step" or an "error" is produced. A "step" means that calibration is done, while an "error" means that calibration is missed due to a failure.

When enabled, the sub-FSM 71, represented on FIG. 17, generates at node 711 (VST for Voltage Start) a starting value of the current voltage (VDD_TRIM) retrieved from the reference set 70. Also, a target value (VDD_LUT) of the supply voltage is extracted from a LUT, e.g. based on a random number generation by the generator 18.

The current voltage value is then compared with the target voltage value, which amounts e.g. to comparing VDD_TRIM to VDD_LUT. If the current voltage is greater than the target voltage (VDD_TRIM>VDD_LUT), a step is performed and the current voltage is decremented by a given unit offset at node 712. The same process is repeated at node 712 as long as the current voltage remains greater than the target voltage.

As soon as the current voltage becomes equal to or smaller than the target voltage, the current stage associated with the active target voltage is stopped at node 713, and a next target voltage is determined. The latter is then used as the new starting value at node 711.

On the other hand, if the current voltage is smaller than the target voltage (VDD_TRIM<VDD_LUT), a step is performed and the current voltage is incremented by a given unit offset at node 714. The same process is repeated at node 714 as long as the current voltage remains smaller than the target voltage.

As soon as the current voltage becomes equal to or greater than the target voltage, the current stage associated with the active target voltage is stopped at node 713, and a next target voltage is determined. The latter is then used as the new starting value at node 711.

Instead of a successful execution along the current reference datapath, an error (which may be a computation error) may occur when iteratively decreasing the current voltage value at node 712. As soon as such a situation happens, the current stage associated with the active target voltage is stopped at node 713, and a next target voltage is determined. The latter is then used as the new starting value at node 711.

This process can possibly enable a smooth transition from an initial power supply state to the next one, thereby enabling smooth stepping ahead to the next value.

In a variant implementation, the intermediary voltage decrementing and incrementing is not used. Care needs then to be taken with power supply sharp transition and overshoot or stability effects.

When enabled, the sub-FSM 72, represented on FIG. 18, generates at node 721 (FST for Frequency Start) a starting value of the current frequency (FREQ_TRIM) retrieved from the reference set 70. Also, a target value (FREQ_LUT) of the clock frequency is extracted from a LUT, e.g. based on a random number generation by the generator 18.

The current frequency value is then compared with the target frequency value, which amounts e.g. to comparing FREQ_TRIM to FREQ_LUT. If the current frequency is greater than the target voltage (FREQ_TRIM>FREQ_LUT), a step is performed and the current frequency is decremented by a given unit offset at node 722. The same process is repeated at node 722 as long as the current frequency remains greater than the target frequency.

As soon as the current frequency becomes equal to or smaller than the target frequency, the current stage associated with the active target frequency is stopped at node 723, and a next target frequency is determined. The latter is then used as the new starting value at node 721.

On the other hand, if the current frequency is smaller than the target frequency (FREQ_TRIM<FREQ_LUT), a step is performed and the current frequency is incremented by a given unit offset at node 724. The same process is repeated at node 724 as long as the current frequency remains smaller than the target frequency.

As soon as the current frequency becomes equal to or greater than the target frequency, the current stage associated with the active target frequency is stopped at node 723, and a next target frequency is determined. The latter is then used as the new starting value at node 721.

Instead of a successful execution along the current reference datapath, an error (which may be a computation error) may occur when iteratively increasing the current frequency value at node 724. As soon as such a situation happens, the current stage associated with the active target frequency is stopped at node 723, and a next target frequency is determined. The latter is then used as the new starting value at node 721.

This process can possibly enable to get a smooth transition from an initial clock frequency state to the next one, thereby enabling smooth stepping ahead to the next value.

In a variant implementation, the intermediary frequency decrementing and incrementing is not used. Care needs then to be taken with frequency sharp transition and overshoot or stability effects.

The generation of the target values stored in the LUT may be obtained by the random number generator 18 as follows.

Regarding the supply voltage, as represented on FIG. 19, the generator 18 comprises a first TRNG module 181 and a first LFSR module 182 programmable over N bits and cooperating with the TRNG module 181. In execution, the TRNG module 181 provides an initial value (called a seed value) to the LFSR module 182. If the latter is enabled ("enable" entry), it generates a target voltage value VDD_LFSR to be exploited for the current voltage value, within a range sized by a maximum threshold value and a minimum threshold value (corresponding to respective bounds 31 and 32). Two alternative or combined ways of obtaining a next target voltage value may then be used: by incrementing the next LFSR value ("INCR" entry) and/or by initializing a new seed to the LFSR ("Load" entry).

Regarding the clock frequency, as represented on FIG. 20, the generator 18 comprises a second TRNG module 183 and a second LFSR module 184 programmable over N bits and cooperating with the TRNG module 183. In execution, the TRNG module 183 provides an initial value (called a seed value) to the LFSR module 184. If the latter is enabled ("enable" entry), it generates a target frequency value FREQ_LFSR to be exploited for the current voltage value, within a range sized by a maximum threshold value and a minimum threshold value (corresponding to respective bounds 41 and 42). Two alternative or combined ways of obtaining a next target frequency value may then be used: by incrementing the next LFSR value ("INCR" entry) and/or by initializing a new seed to the LFSR ("Load" entry).

More will be developed below about the first digital module 11, which can be used to monitor a power supply and to track a critical path inside the ASIC 1.

FIG. 21 represents a synchronous design datapath operation, in which a function F is applied to two operands (registers X and Y) so as to produce a result (register Z).

A fully synchronous design can be built to create such a combinational path between two sequential elements. The particularity of the combinational path is that is has usually to be as long as the clock period minus the setup time and clock uncertainty margins. By proceeding in that way, the datapath propagates during most of the entire clock period.

FIG. 22 represents a timing diagram principle in the datapath execution. When glitches occur (only negative glitches on VDD supply being considered), the datapath timing is slowed down, therefore the remaining setup margin (positive timing slack) is decreased and a timing violation may occur.

In traditional prior art implementations, this design works at a given clock frequency, which may be a weakness of such a system, since it is then sized to work for the worst case process condition and for a maximum clock frequency of use.

In particular embodiments of the present disclosure, data may be transmitted via binary values from flip-flops (logic circuits, most of the time synchronous with the clock).

These flip-flops need a certain amount of time to stabilize (i.e. move from an unstable state to a steady state). If a glitch appears when the flip-flop is unstable, it can disrupt the result. Now, a margin exists in all cases for avoiding a violation and ensuring that the flip-flop has enough time to stabilize during the clock period.

The manufacturer is usually in charge of defining the size of this margin, which typically covers a range from Typical PVT to Max PVT (i.e. WCS). So, if a glitch occurs within the time margin, it does not affect the state of the flip-flop since the flip-flop is already in a stable state. Therefore, such a glitch has no effect on the transmitted data (issued from the state of the flip-flop).

The digital system 10 may dynamically reduce the value of the setup margin until reaching a set value which can be as small as possible. The term "dynamically" indicates that the process is not fixed in time, but is instead performed or renewed constantly to be closer to the conditions of the present moment.

More precisely, the datapath delay may be modified by adding trimming buffers up to creating a timing violation (critical datapath). This enables a tracking of maximum possible datapath delays before triggering errors, i.e. to be close to operational limits of the system, subject to a safety margin. The same process can be repeated for any or each combination of values of the supply voltage and the clock frequency.

FIG. 23 represents an adaptive timing design. With this kind of behavior, the system may always be close to the limits of the timing critical path, and self-calibrating. So the variation coverage may be broad. Also, the margin may be substantially constant because it is dynamically defined with respect to a level which closely follows the time variations of the datapath over time (e.g. unstable part of the flip-flop within the period T). Indeed, the datapath duration (which corresponds to a propagation delay in the digital system 10) varies according to the conditions: for example when powering up an electronic circuit (cold state), the datapath duration is shorter than when this circuit normally has a higher temperature after some minutes—warm state.

FIG. 24 represents an adaptive digital sequencing. The architecture is based on an engine (or a system) that comprises a calibration mode (with the reference datapath) and a running mode (with the operational datapaths). Two engines 101 and 102, which may be identical, are configured for working in parallel and in alternating tasks during successive phases. While system 101 is running, system 102 is self-calibrating to follow the PVT, OCV, frequency, jitter variations, and conversely. The calibration may include finding values of the supply voltage and of the clock frequency proper for reaching a critical path, so that the datapath can be artificially lengthened with respect to the clock period.

When the calibration is done, the two systems 101 and 102 are swapped. System 101 is then self-calibrating while system 102 is running according to the calibrated setup. The system is self-adaptive.

The phases during which the systems 101 and 102 work in a given mode (calibration or running) may have durations determined by the calibration operations. Namely, they may depend essentially on a time taken for detecting a critical path (violation zone), from which a limit operating point just below the critical path can be derived by using a safety margin.

Changes over time may thus be dynamically taken into account in calibration, amounting to system tracking.

Through the calibration, the margin up to the critical path may be reduced. Accordingly, a difference between the clock period and a time required to traverse the datapath may be made compliant with a determined (possibly adjustable) set value.

In a particular implementation using iterations, a travel time of the signal, corresponding to the datapath, may be extended towards the critical point, until the latter is exceeded. This limit operating point may be detected by comparison between a calculated result (e.g. from a function based on two operands) and an expected result. For example, if the calculated result is less than the expected result, a bit 0 is output and iterations are pursued, while if the calculated result is equal to or greater than the expected result, the critical path has been reached so that the limit operating point has been exceeded. Accordingly, a trimming register value (i.e. the value in bits which corresponds to the additional time to be added to reach or exceed the critical path) is slightly reduced so as to obtain a desired residual margin between the time equivalent to the critical path and the related clock period.

The residual margin allows the system to function properly without generating errors, taking account of usual circuit disturbances such as noise, jitter or poorly filtered supply.

Iteratively determining the limit operating point may be done by successively lengthening the datapath time by a constant incremental value. Alternatively, it may be done by making larger jumps and going back half of the increment of the last jump if the limit operating point has been exceeded.

In other implementations, determining the limit operating point may be achieved by shifting the clock, i.e. trimming the clock, so as to adjust the clock signal on the datapath rather than lengthening the datapath within a given duration, such as a clock period. A translation of the clock signal may take place until reaching the limit operating point at the downstream end of the datapath.

FIG. 25 represents an adaptive PVT, OCV, frequency tracking and jitter variations system relying on systems 101 and 102. It may allow to track variations from the worst case to the best case in order to support the full range of characterization of the device.

FIG. 26 shows a particular adaptive datapath architecture, enabling to detect errors. A usual nominal path is illustrated in continuous line, to obtain from two operands A and B received in respective inputs 91 and 92 a result 93 at the output of a function 94 applied to these operands A, B. For example, each of the operands are representing a value of 8 bits (only one bit being schematically illustrated on FIG. 26). The function 94 may be programmable, and may be a set of arithmetic functions configurable by a register to create a larger range of datapath.

Along the nominal path, the operands A (bit 0) and B (bit 1) are introduced in a multiplexer MUX 98 (left). Out of this MUX 98, information is directly routed to the function 94 which performs an operation involving these two operands A and B.

The operand A has a fixed timing datapath, while the operand B has a programmable delay datapath using a trimming register 96. The operand B can thus be slowed down by applying delay cells 97 to specific selected bits. By creating a delay on one operand, the output result 93 might arrive later on a capture register, and then create a timing violation. Once the result of the calculus is bad, this means a critical timing point of the trimming register 96 is reached.

The path 95 in dotted line corresponds to an associated extended path. Indeed, at the output of the MUX 98, the calculation function is not directly performed, but instead, the path is extended through a programmable element (i.e. configurable element) that includes a succession of delay cells 97. During the first iteration, the path is lengthened by passing through the first delay cell. If the bit (0) issuing from the comparator indicates that the critical point has not been reached, then the path 95 is successively extended by adding in turn an additional delay cell. The programmable element can typically comprise 32 or 64 delay cells, each representing a bit so that the trimming register 96 can have e.g. a depth of 32 or 64 bits (generally speaking N bits of depth). That depth determines the delay to impose on the nominal path so that the adapted path 95 can have a length such that the residual margin is consistent with what is sought.

A "delay cell" is typically calibrated (by the manufacturer) at 0.3 ns or 0.6 ns. These values generate respective delays of 0.5 ns or 0.8 ns in the WCS (Worst Case Scenario) case, but different respective delays, namely 0.2 ns or 0.3 ns in the BCS (Best Case Scenario) case. Since these delay cells 97 are sensitive to PVT conditions (like all cells), their response usually varies over time. In general, 1 WCS trimming bit is equivalent to 3 trimming bits in BCS conditions (trimming bits=bits of the trimming register 96 which define the size extension of the datapath 95). So, in WCS conditions, it is appropriate to have a slight incrementing (small step, e.g. bit after bit), whereas in BCS conditions, larger increments can be used (bigger step, e.g. step of 3 bits).

The result 93 calculated by the function 94 is routed to a comparator 99 that compares this result with a first expected result 931. If the calculated result 93 is e.g. less than the first expected result 931, the comparator outputs a bit 0. On the other hand, if the calculated result 93 is e.g. greater than or equal to the expected result 91, the comparator provides a bit 1 which indicates that the critical point has been reached or exceeded.

Also, operands A and B are swapped (inverted) at each clock stroke. This generates a new calculation whose response is usually different from that of the previous calculation. Namely, with 8 or 16 bits, the number of distinct bits (i.e. the entropy) is expected to be significant. The result 93 based on the swapped operands A and B is compared with a second expected result 932.

For calibration, the system may start from trimming bit empty, and increment the trimming at each clock cycle. When a limit operating point is detected, the system stops the calibration and sends a "step" signal to the sub-FSMs 71 and 72. The latter then change the current voltage value (VDD_TRIM) and/or frequency value (FREQ_TRIM). The calibration is subsequently started again with the modified parameter values.

Once a trimming value that creates a timing error is found, a margin value may be subtracted so as to allow the system to run properly without false errors. The margin value may be always applied in effectively running the datapath, so as to reduce risks of potential computation failures.

Those implementations may allow a minimal or at least controlled residual margin.

On the ground of the present disclosure and of the detailed embodiments, other implementations are possible and within the reach of a person skilled in the art without departing from the scope of the invention. Specified elements can notably be interchanged or associated in any manner remaining within the frame of the present disclosure. Also, elements of different implementations may be combined, supplemented, modified, or removed to produce other implementations. All those possibilities are contemplated by the present disclosure.

The invention claimed is:

1. A method for controlling working conditions of a hardware component to camouflage current traces generated by the hardware component, the hardware component having at least one set of digital elements defining a plurality of operational datapaths, the method comprising:
 (a) obtaining a random or pseudo-random value and using the random or pseudo-random value to adjust, by a control element, a working condition of the hardware component to generate an adjusted working condition;
 (b) measuring a reaction of the hardware component to the adjusted working condition by a logic test circuit through processing data operations along a reference datapath of the plurality of operational datapaths, the reference datapath having a minimum duration corresponding to at least a longest of said the plurality of operational datapaths in the hardware component;
 (c) detecting whether an error has taken place along the reference datapath by the logic test circuit based on the reaction measured at step (b);
 (d) in response to a detection, at step (c), that the error has occurred, modifying the adjusted working condition by the control element, to generate a modified working condition.

2. The method of claim 1, wherein:
the working condition comprises at least one of a supply voltage and a clock frequency.

3. The method of claim 1, wherein:
when no error is detected in step (c), the method includes:
(e) adopting the modified adjusted working condition.

4. The method of claim 1, wherein:
the method comprises iterating over time steps (a) to (d).

5. The method of claim 4, wherein:
the working condition of the hardware component is an initial working condition;
the method further comprises, after step (d):
(e) measuring a reaction of the hardware component to the modified working condition by the logic test circuit through processing data operations along the reference datapath, to detect whether another error has taken place; and
(f-i) if the other error is detected, repeating steps (d), (e), and (f-i).

6. The method of claim 5, wherein:
if no error is detected in step (e), the method further comprises:
(f-ii) adopting the modified working condition; and
(g) repeating steps (a) to (e) and either step (f-i) or steps (f-ii) and (g).

7. The method of claim 5, wherein:
if no error is detected in step (e), the method further includes the steps of:
(f-ii) adopting the modified working condition;
(g) determining whether a jamming operation is over;
(h) if it is determined that the jamming operation is not over, repeating steps (a) to (e) and either step (f-i) or steps (f-ii), (g), and (h).

8. The method of claim 1, comprising:
using the random or pseudo-random value by the control element as a target value and adjusting iteratively the working condition of the hardware component towards the target value.

9. The method of claim 8, wherein:
the target value is between a minimum bound and a maximum bound of a value of the working condition.

10. The method of claim 8, wherein:
step (a) includes:
(a-i) generating, based on the random or pseudo-random value, an initial target value for the working condition; and
(a-ii) incrementing or decrementing the working condition by a predetermined interval towards the initial target value, to generate the adjusted working condition;
step (b) includes: measuring a reaction of the hardware component to the adjusted working condition by the logic test circuit through processing data operations along the reference datapath; and
if no error is detected in step (c):
adopting the adjusted working condition and repeating steps (a-ii), (b), and (c); and
if the error is detected in step (c), or if the initial target value of the working condition has been reached, then step (d) further comprises:
repeating step (a-i) to generate a successive initial target value for the working condition, which is the modified working condition; and
repeating steps (a-ii), (b) and (c).

11. The method of claim 10, wherein:
in step (a-ii), the predetermined interval is smaller than average variation gaps between successive initial target values.

12. A hardware component comprising:
at least one set of digital elements defining a plurality of operational datapaths;
a control element acting on a working condition of the hardware component;
a logic test circuit for processing data operations along a reference datapath of the plurality of operational datapaths, the reference datapath having a minimum duration corresponding to at least a longest of the plurality of operational datapaths in the hardware component,
wherein the hardware component is configured to:
(a) obtaining a random or pseudo-random value and using the random or pseudo-random value to adjust, by the control element, a working condition of the hardware component to generate an adjusted working condition;
(b) measure, by the logic test circuit, a reaction of the hardware component to the adjusted working condition through processing data operations along the reference datapath;
(c) detect, by the logic test circuit, whether an error has taken place along the reference datapath based on the reaction measured at step (b);
(d) in response to a detection, at step (c), that the error has occurred, modify, by the control element, the adjusted working condition, to generate a modified working condition.

13. The hardware component of claim 12, wherein:
the working condition comprises at least one of a supply voltage and a clock frequency.

14. The hardware component of claim 12, wherein:
the working condition of the hardware component is an initial working condition;
the hardware component is further configured, after step (d), to:
(e) measure, by the logic test circuit, a reaction of the hardware component to the modified working condition through processing data operations along the reference datapath, to detect whether another error has taken place; and
(f-i) if the other error is detected, repeat steps (d), (e), and (f-i).

15. The hardware component of claim 12, wherein:
if no error is detected in step (e), the hardware component is further configured to:
(f-ii) adopt the modified working condition; and
(g) repeat steps (a) to (e) and either step (f-i) or steps (f-ii) and (g).

16. The hardware component of claim 12, wherein:
the control element is configured to use the random or pseudo-random value as a target value, and iteratively to adjust the working condition of the hardware component towards the target value.

17. The hardware component of claim 16, wherein:
during step (a) the hardware component is configured to:
(a-i) generate, based on the random or pseudo-random value, an initial target value for the working condition; and
(a-ii) increment or decrement the working condition by a predetermined interval towards the initial target value, to generate the adjusted working condition;
in step (b), the logic test circuit is configured to measure a reaction of the hardware component to the adjusted working condition through processing data operations along the reference datapath; and if no error is detected in step (c):
the hardware component is configured to adopt the adjusted working condition and repeat steps (a-ii), (b), and (c); and if the error is detected in step (c), or if the initial target value of the working condition has been reached, the hardware component is configured to, at step (d):
repeat step (a-i) to generate a successive initial target value for the working condition, which is the modified working condition; and
repeat steps (a-ii), (b) and (c).

18. The hardware component of claim 17, wherein:
in step the predetermined interval is smaller than average variation gaps between successive initial target values.

* * * * *